United States Patent [19]

Owen et al.

[11] Patent Number: 5,153,880
[45] Date of Patent: Oct. 6, 1992

[54] FIELD-PROGRAMMABLE REDUNDANCY APPARATUS FOR MEMORY ARRAYS

[75] Inventors: William H. Owen, Los Altos Hills; John Caywood, Sunnyvale; Joseph Drori, San Jose; James Jaffe, Santa Clara; Isao Nojima, Sunnyvale; Jeffrey Sung; Ping Wang, both of Saratoga, all of Calif.

[73] Assignee: Xicor, Inc., Milpitas, Calif.

[21] Appl. No.: 491,749

[22] Filed: Mar. 12, 1990

[51] Int. Cl.$^5$ .............................. G06F 11/20
[52] U.S. Cl. ......................... 371/10.2; 365/200
[58] Field of Search ............ 371/10.3, 10.2, 10.1, 371/11.1; 365/200

[56] References Cited

U.S. PATENT DOCUMENTS

| | | | |
|---|---|---|---|
| 4,263,664 | 4/1981 | Owen et al. | 365/185 |
| 4,274,012 | 6/1981 | Simko | 307/238.3 |
| 4,300,212 | 11/1981 | Simko | 365/185 |
| 4,326,134 | 4/1982 | Owen et al. | 307/268 |
| 4,393,474 | 7/1983 | McElroy | 365/200 |
| 4,404,475 | 9/1983 | Drori et al. | 307/264 |
| 4,581,739 | 4/1986 | McMahon, Jr. | 371/21 |
| 4,598,388 | 7/1986 | Anderson | 365/200 |
| 4,599,706 | 7/1986 | Guterman | 365/185 |
| 4,617,652 | 10/1986 | Simko | 365/203 |
| 4,745,582 | 5/1988 | Fukushi | 371/10.3 X |
| 4,750,158 | 6/1988 | Giebel | 371/10.3 X |
| 4,768,169 | 10/1988 | Perlegos | 365/200 |
| 4,791,615 | 12/1988 | Pelley | 371/10.3 |
| 4,827,452 | 5/1989 | Toyama | 371/10.3 X |
| 4,849,938 | 7/1989 | Furutani | 371/10.3 |
| 4,862,416 | 8/1989 | Takeuchi | 365/200 X |
| 4,975,881 | 12/1990 | Kagami | 371/10.3 X |

OTHER PUBLICATIONS

"JEDEC Standard No. 21-B: Configurations for Solid State Memories", Electronic Industries Association, Dec., 1988.

Chin-Long Wey, et al., "On the Design of a Redundant Programmable Logic Array (RPLA)", *IEEE Journal of Solid-State Circuits*, vol. SC-22, No. 1, Feb. 1987.

*Primary Examiner*—Robert W. Beausoliel

[57] ABSTRACT

A field-programmable redundancy apparatus for integrated circuit semiconductor memory arrays is disclosed. The present invention allows the user to replace a defective memory cell with a redundant memory cell while the integrated circuit memory array is in the field. The user communicates with the redundancy apparatus over the standard signal paths with standard voltage levels of the integrated circuit semiconductor memory array. The redundancy apparatus detects a predetermined code sequence on one or more of the address and data lines of the memory array to enter a special redundancy-reconfiguration mode. In the reconfiguration mode, the redundancy apparatus provides information on the availability and functionality of the redundant memory cells and enables the user to replace a defective memory cell with a selected redundant memory cell. The field-programmable redundance apparatus may comprise nonvolatile memory means, such as EEPROM's, to store the replacements of primary memory cells with redundant memory cells. In the reconfiguration mode, detection of a second predetermined code sequence causes the reconfiguration mode to be exited.

27 Claims, 17 Drawing Sheets

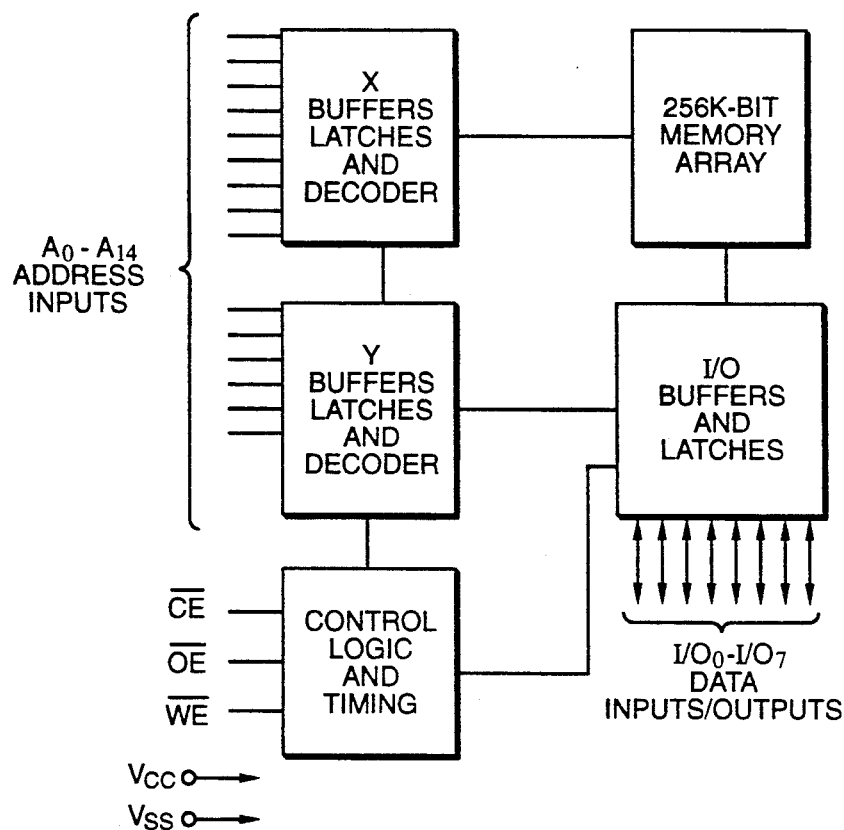
FIG._1
(PRIOR ART)
| CONTROL SIGNALS | | | FUNCTIONALITY MODE | I/O STATUS |
|---|---|---|---|---|
| $\overline{CE}$ | $\overline{OE}$ | $\overline{WE}$ | | |
| L | L | L | WRITE INHIBIT | HIGH-Z |
| L | L | H | READ | OUTPUT |
| L | H | L | WRITE | INPUT |
| L | H | H | WRITE INHIBIT | HIGH-Z |
| H | X | X | STAND BY WRITE INHIBIT | HIGH-Z |
FIG._2
(PRIOR ART)

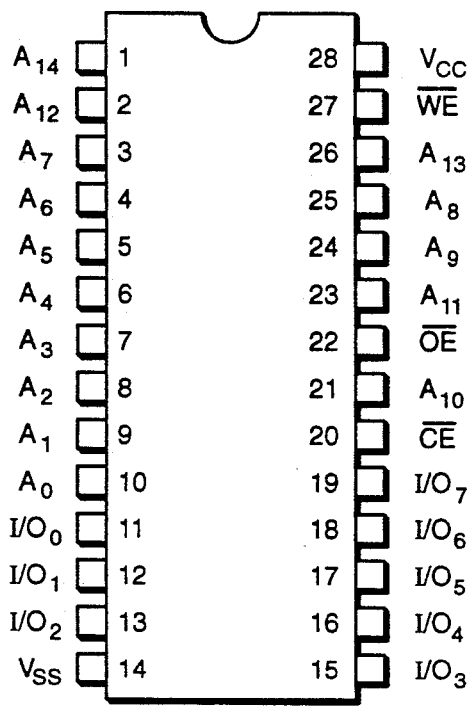
FIG._3A
(PRIOR ART)
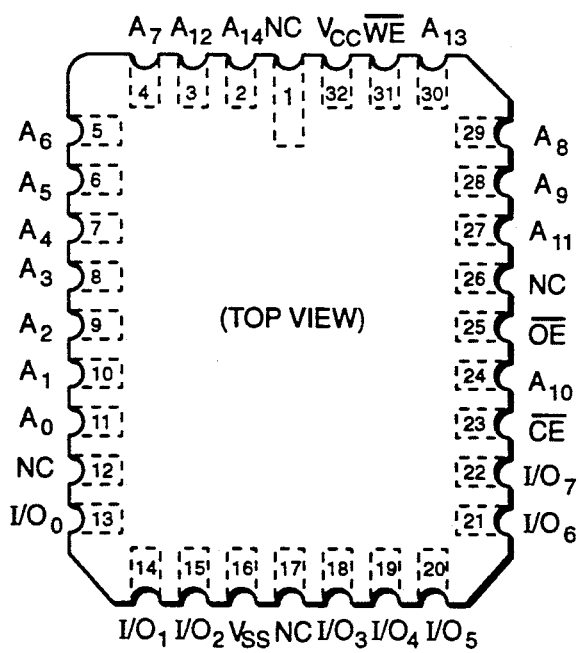
FIG._3B
(PRIOR ART)
JEDEC PIN CONFIGURATIONS
| $A_0 - A_{14}$ | ADDRESS INPUTS |
| $I/O_0 - I/O_7$ | DATA INPUT/OUTPUT |
| $\overline{WE}$ | WRITE ENABLE |
| $\overline{CE}$ | CHIP ENABLE |
| $\overline{OE}$ | OUTPUT ENABLE |
| $V_{CC}$ | +5V |
| $V_{SS}$ | GROUND |
| NC | NO CONNECT |
FIG._3C
(PRIOR ART)

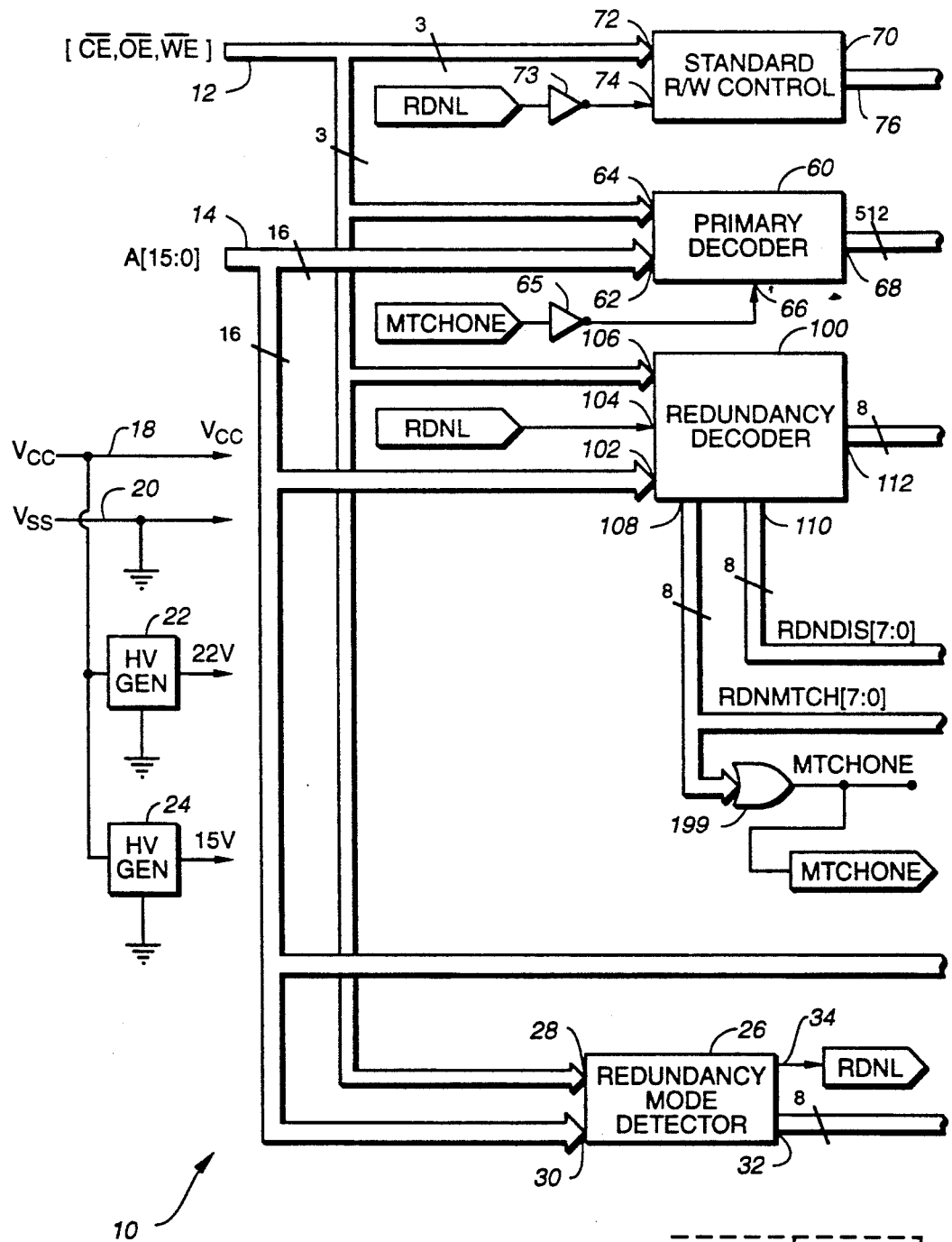
FIG._4A
FIG._4

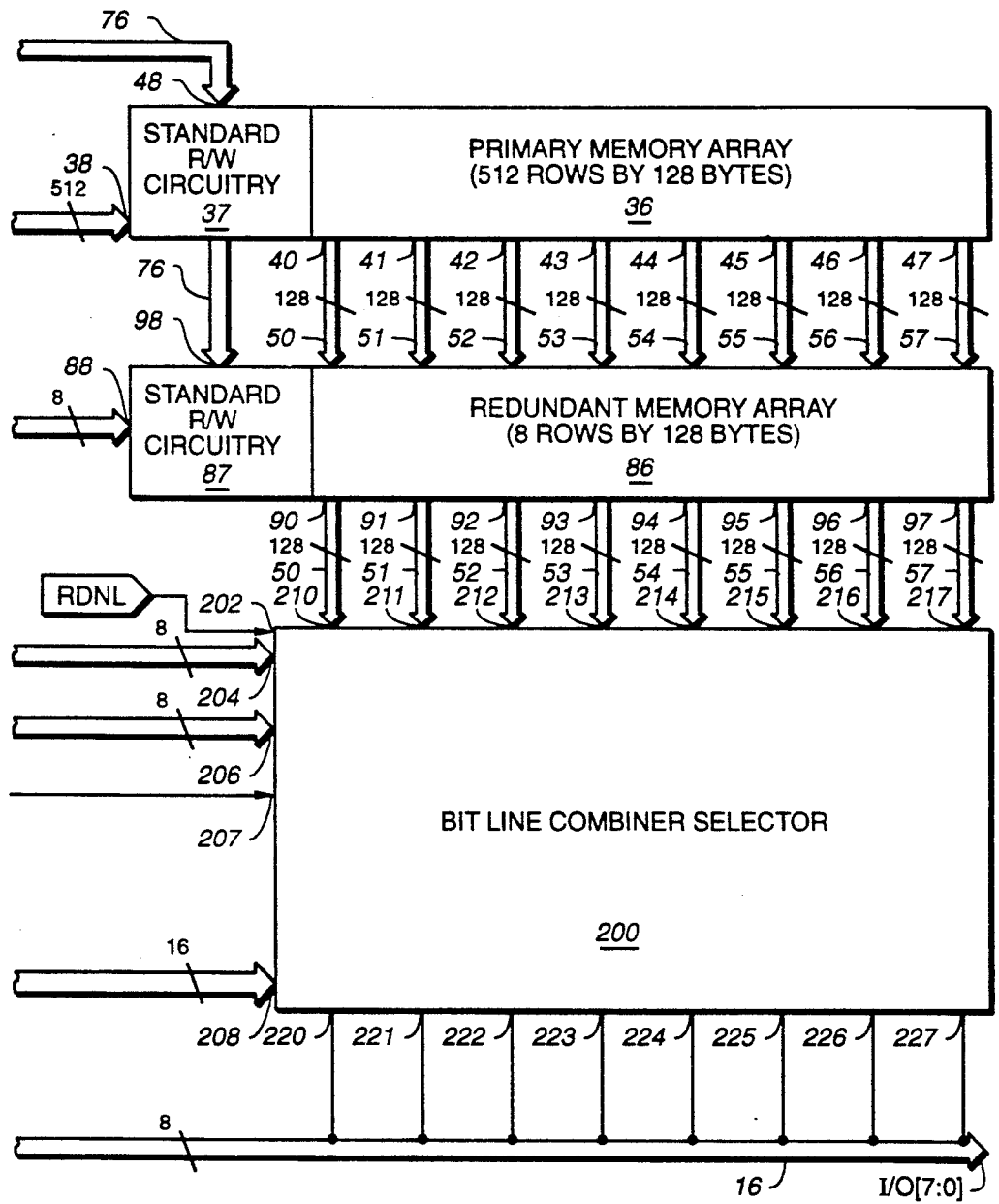
FIG._4B

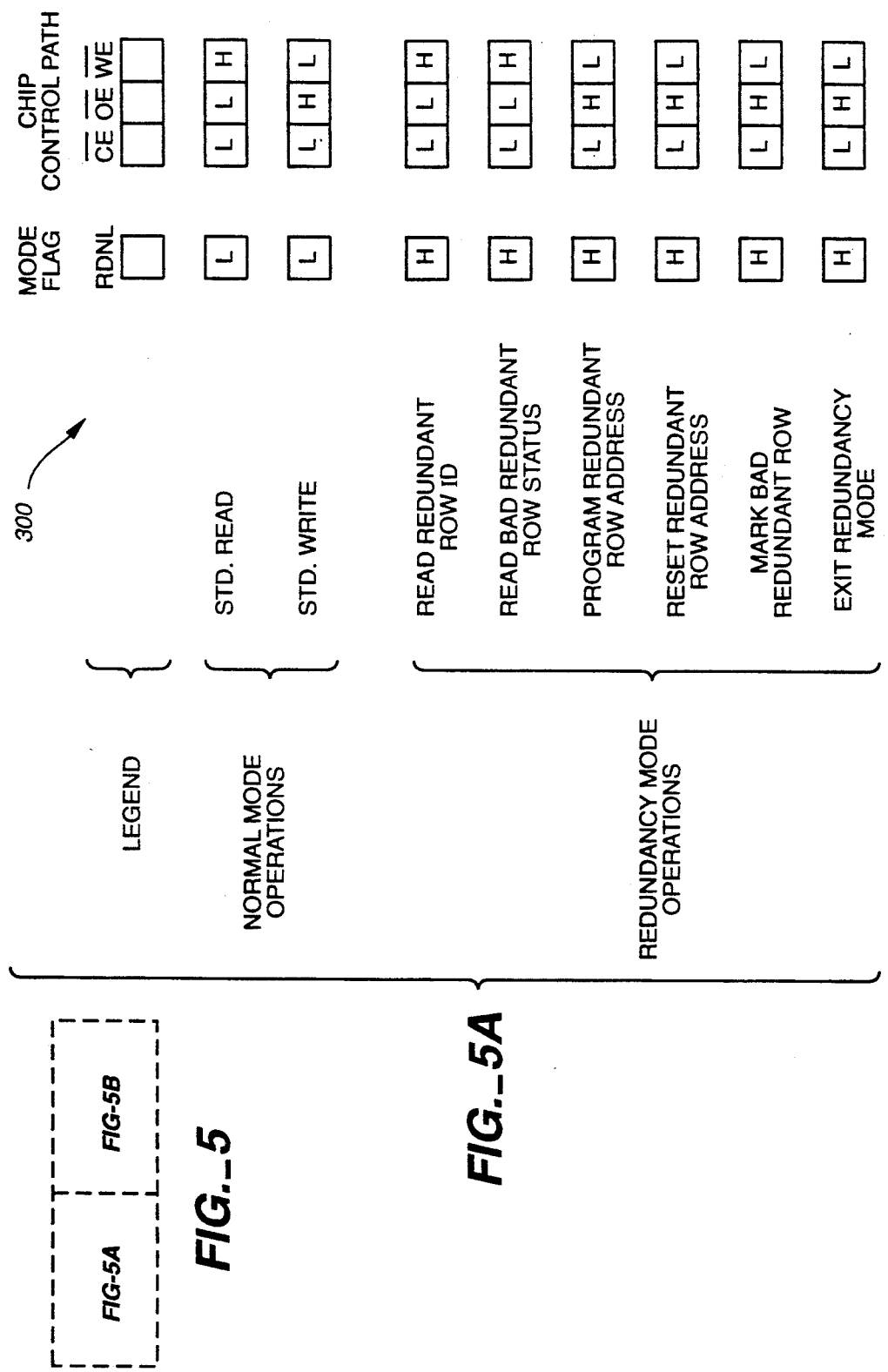

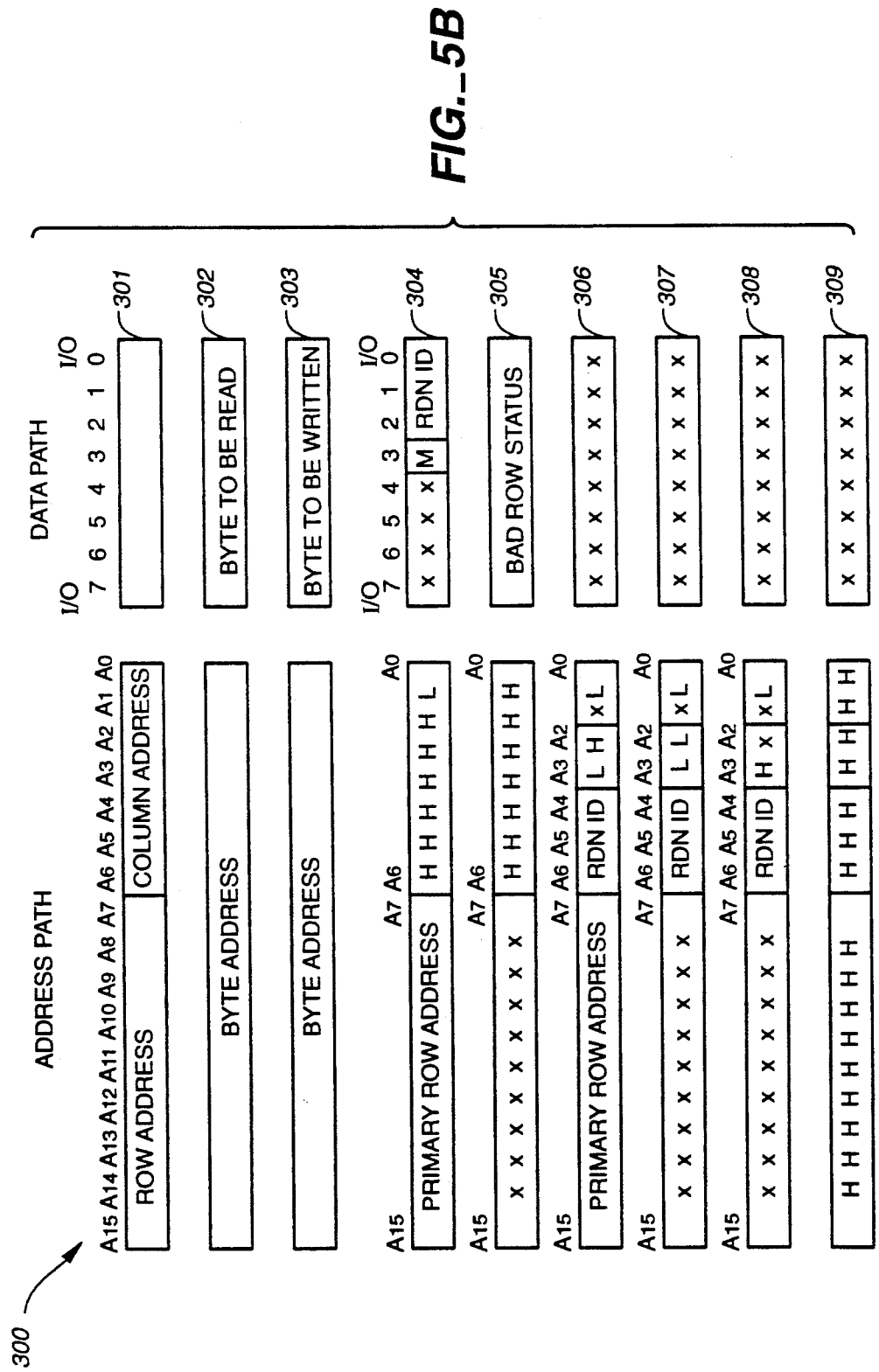
FIG._5B

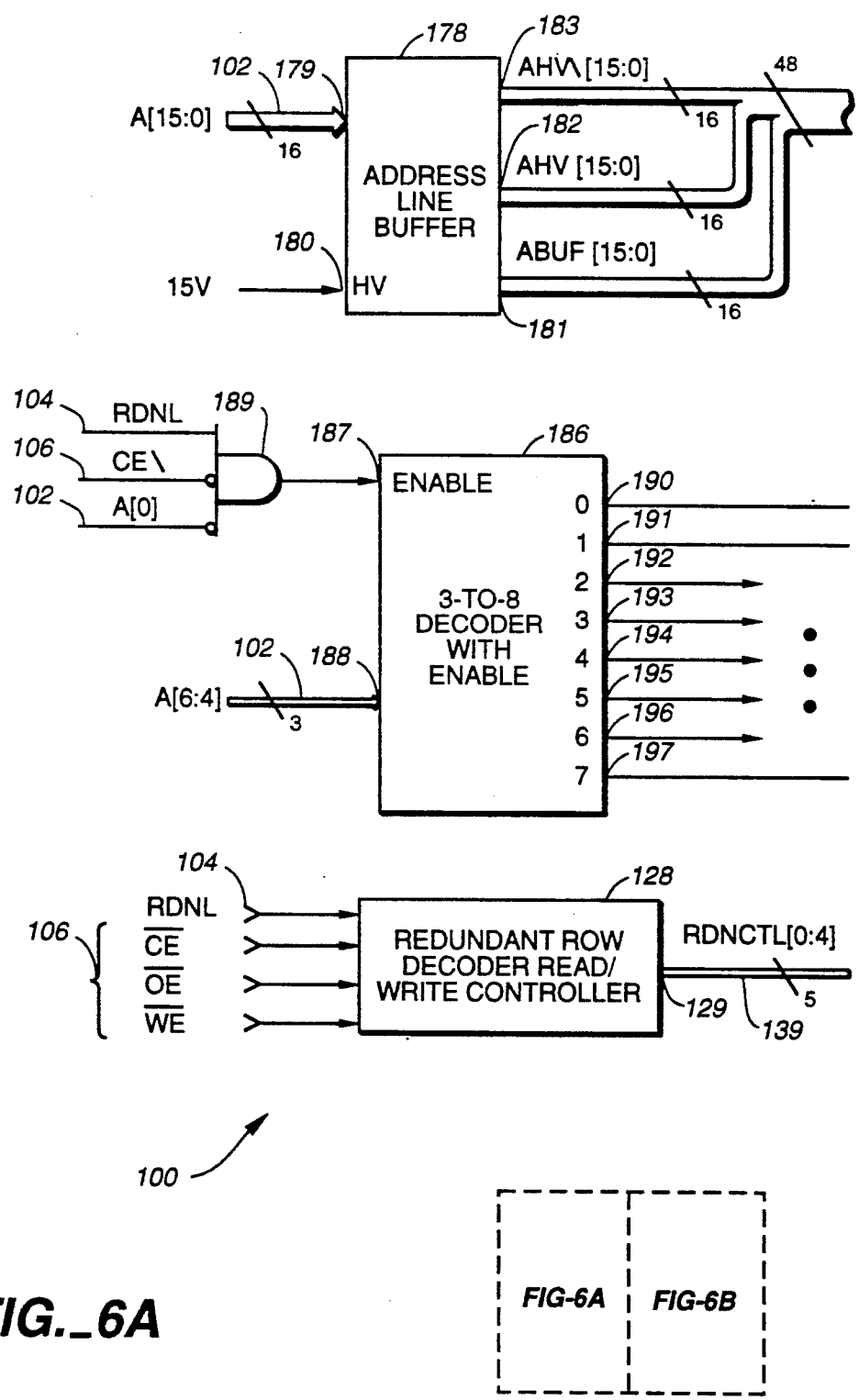
*FIG._6A*
*FIG._6*

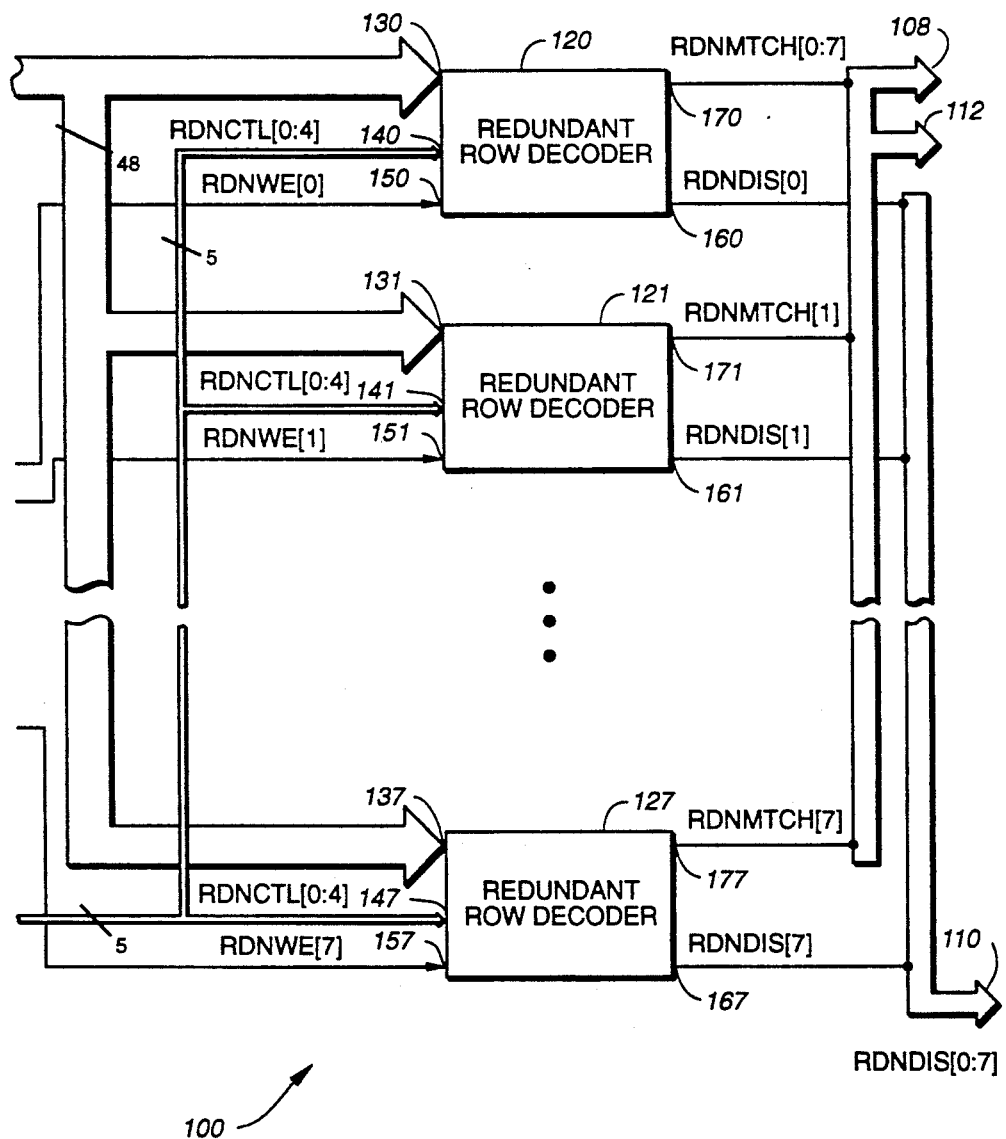
FIG._6B

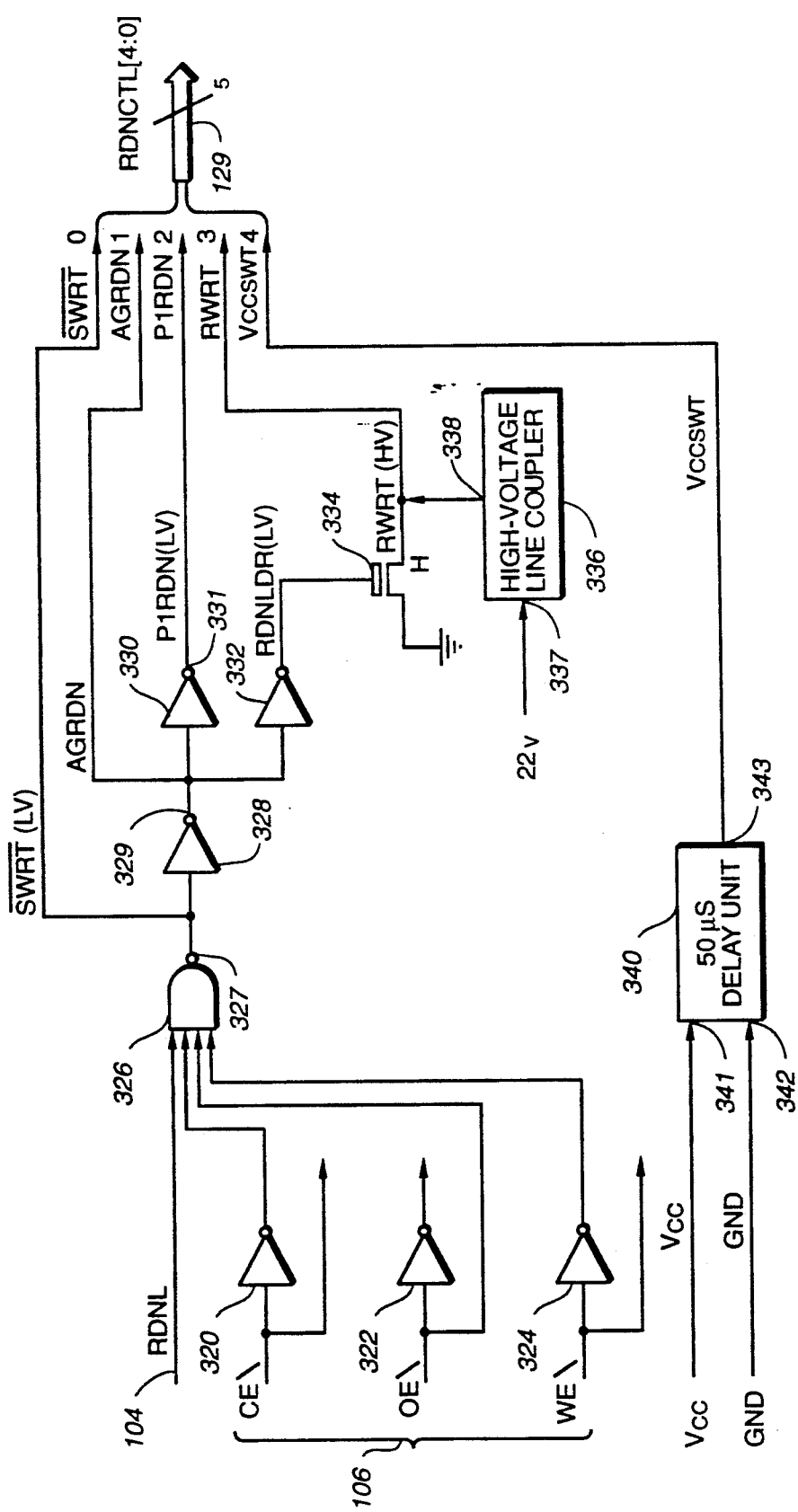
FIG._7

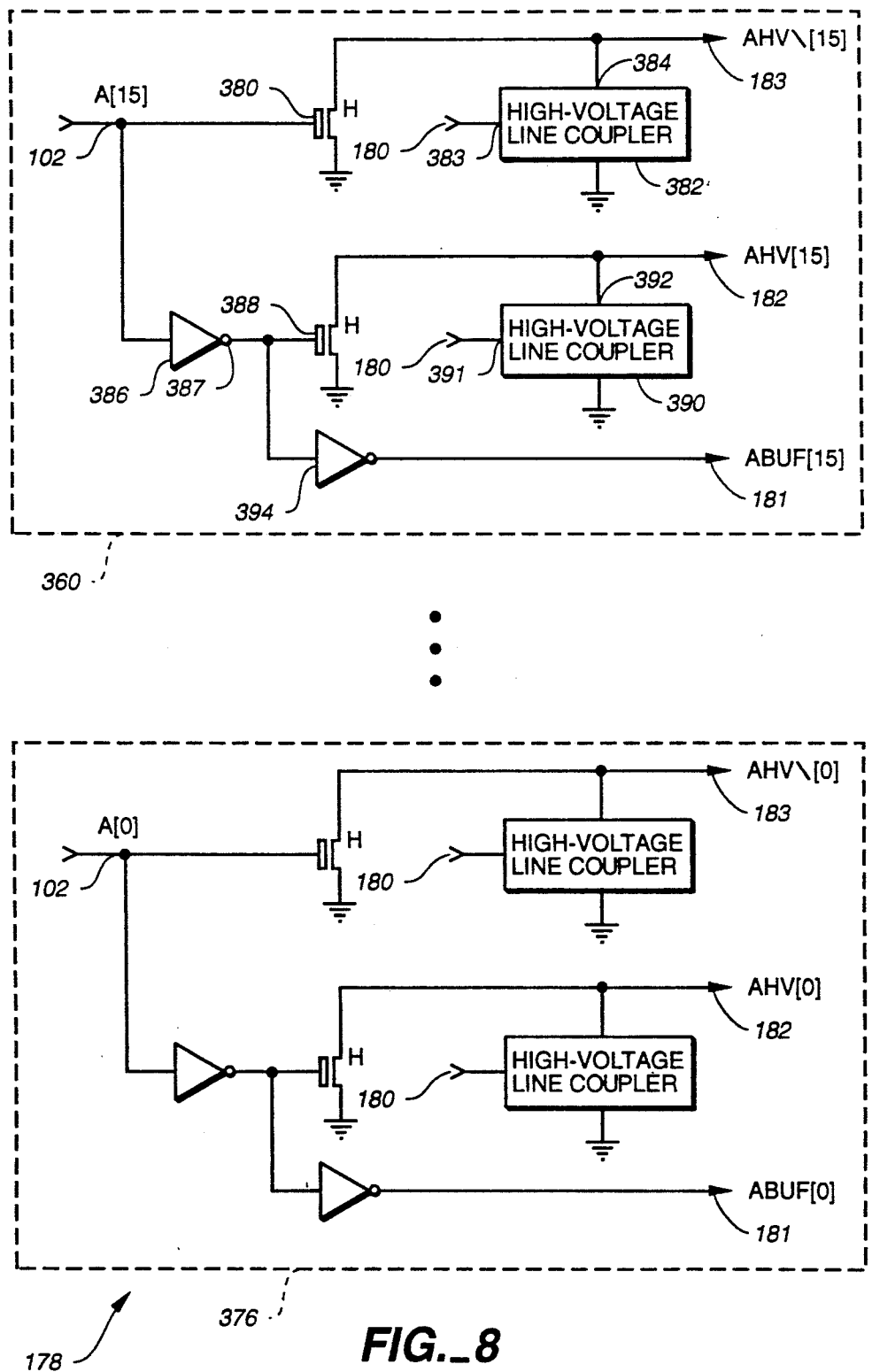
FIG._8

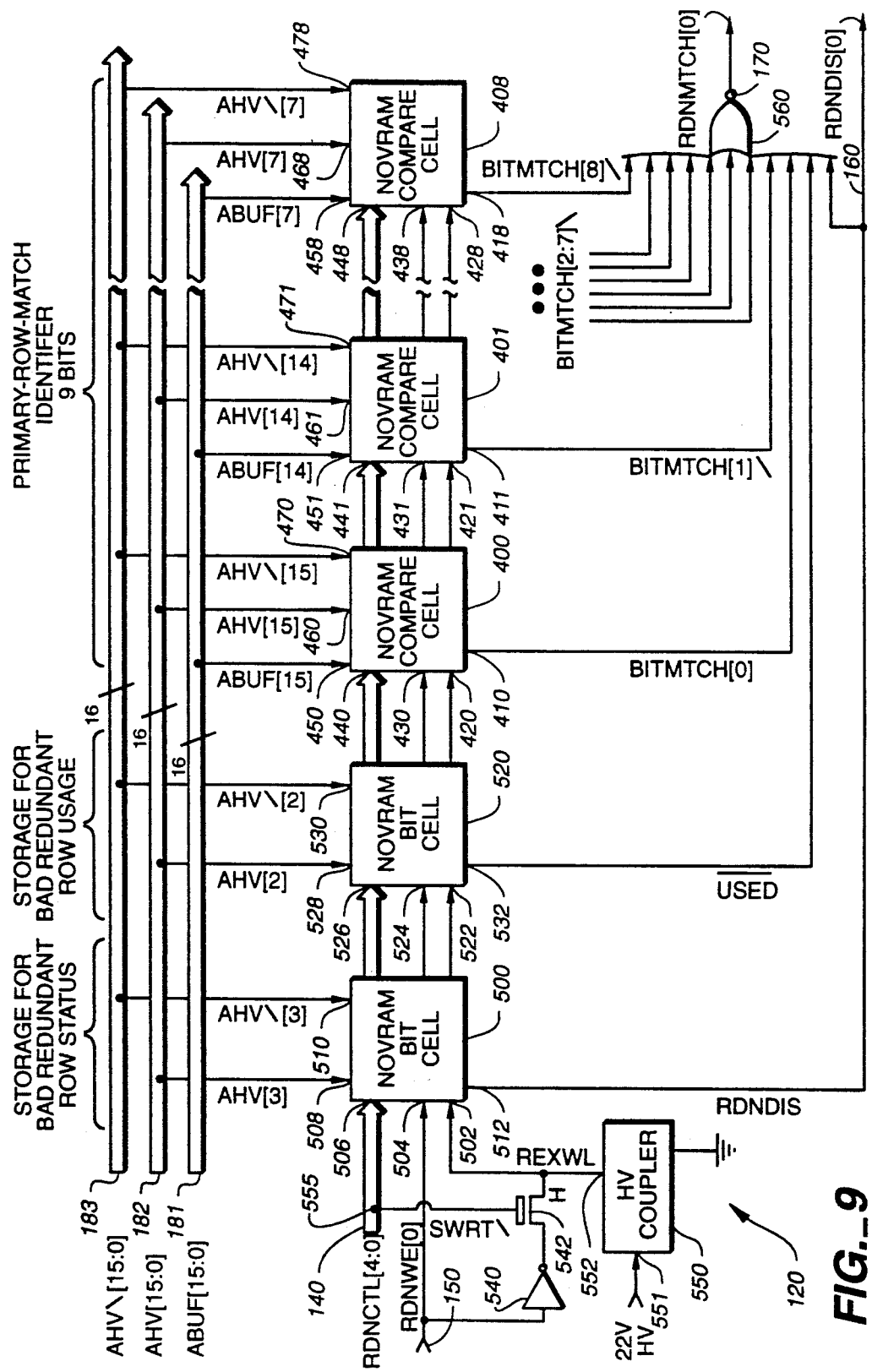
FIG._9

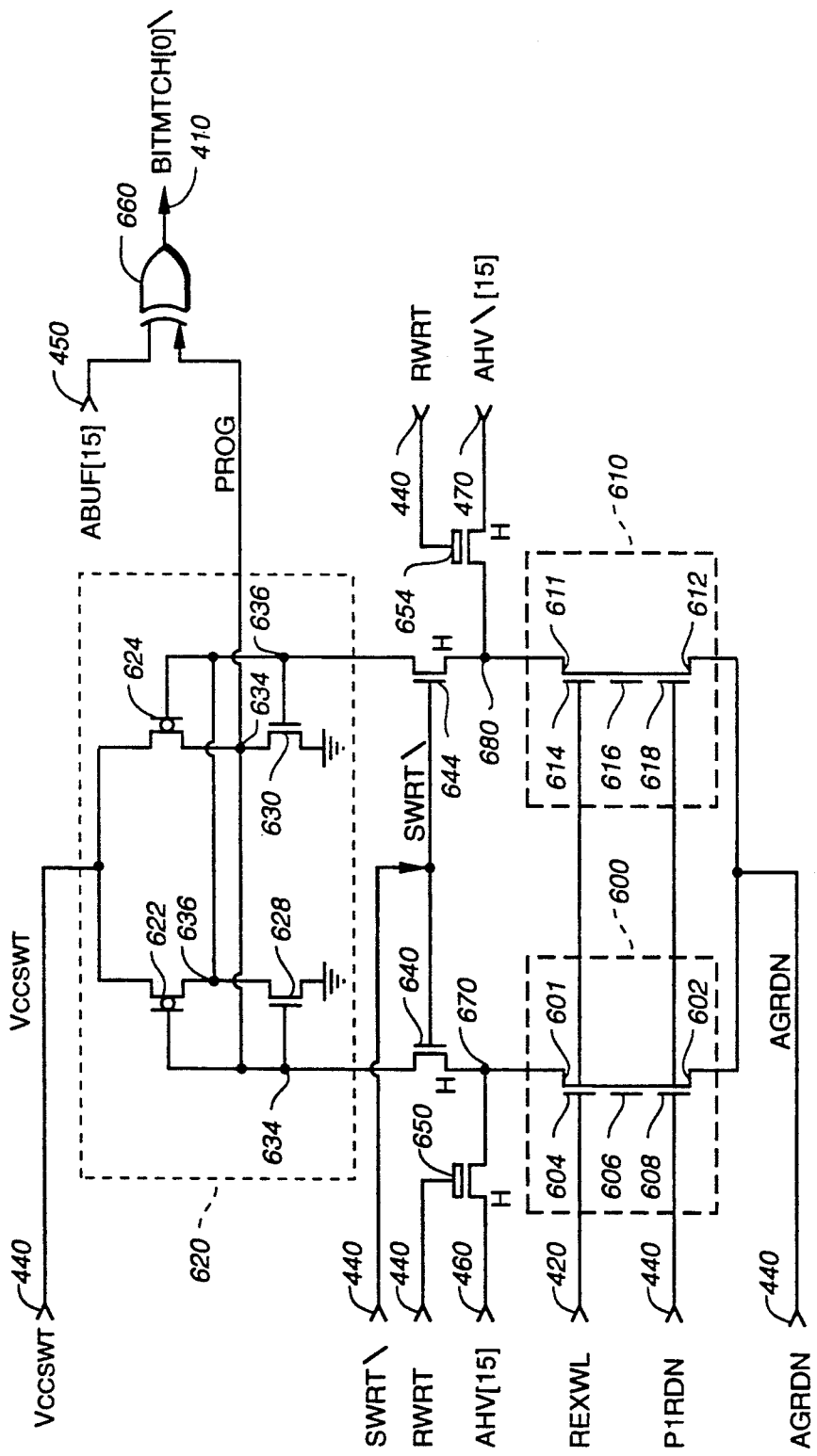
FIG._10A

690

|  | NORMAL MODE BOTH READ+WRITE | REDUNDANCY MODE READ | WRITE |
|---|---|---|---|
| SWRT\<br>AGRDN<br>P1RDN<br>RWRT<br>VCCSWT | H<br>L<br>H<br>L<br>H | H<br>L<br>H<br>L<br>H | L<br>H<br>L<br>HV(22v)<br>H |
| REXWL | H(5v) | L | HV(22v) |
| AHV[15]<br>AHV\[15] | X | X | PROGRAM VALUES(15v) |

FIG._10B

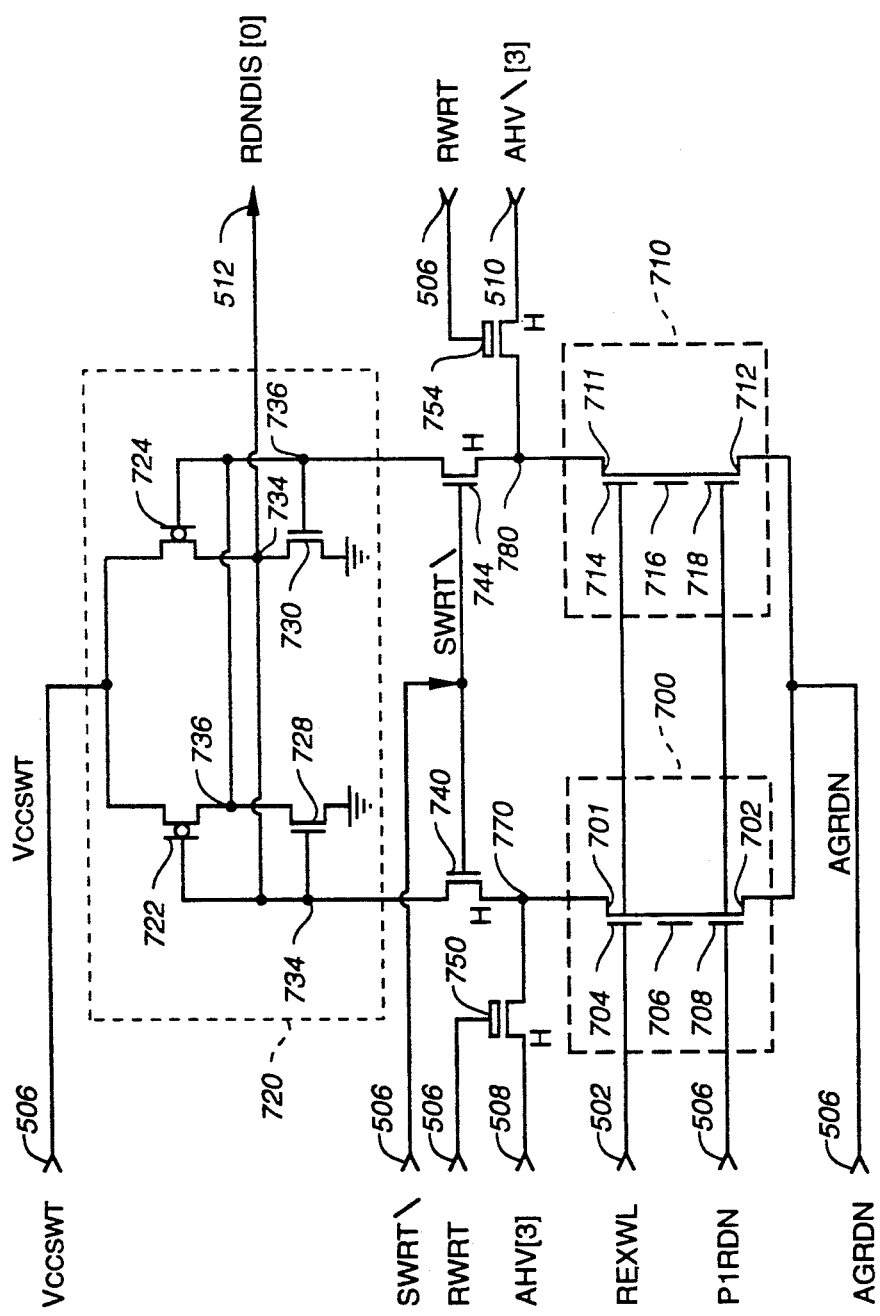
FIG._11

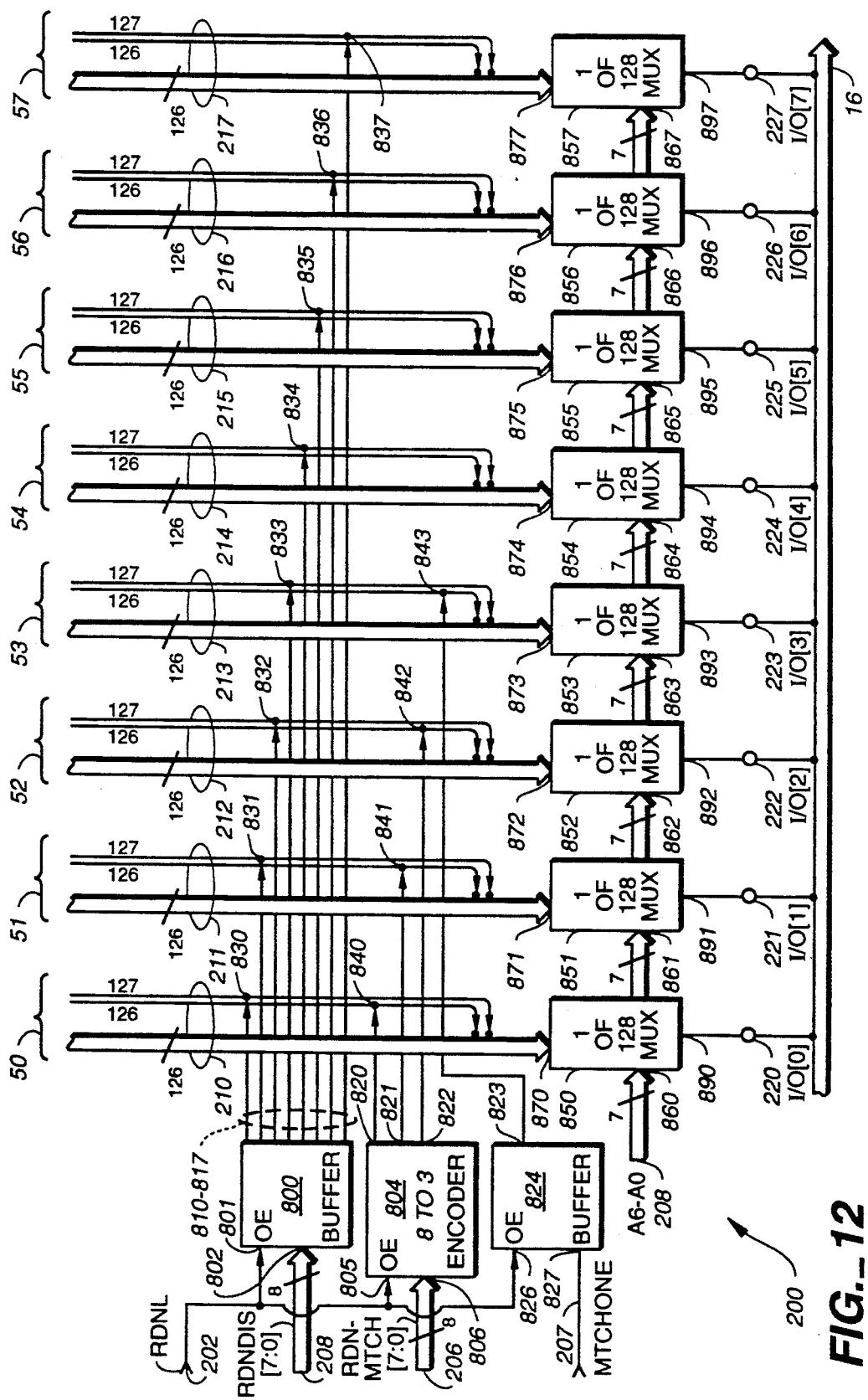
FIG._12

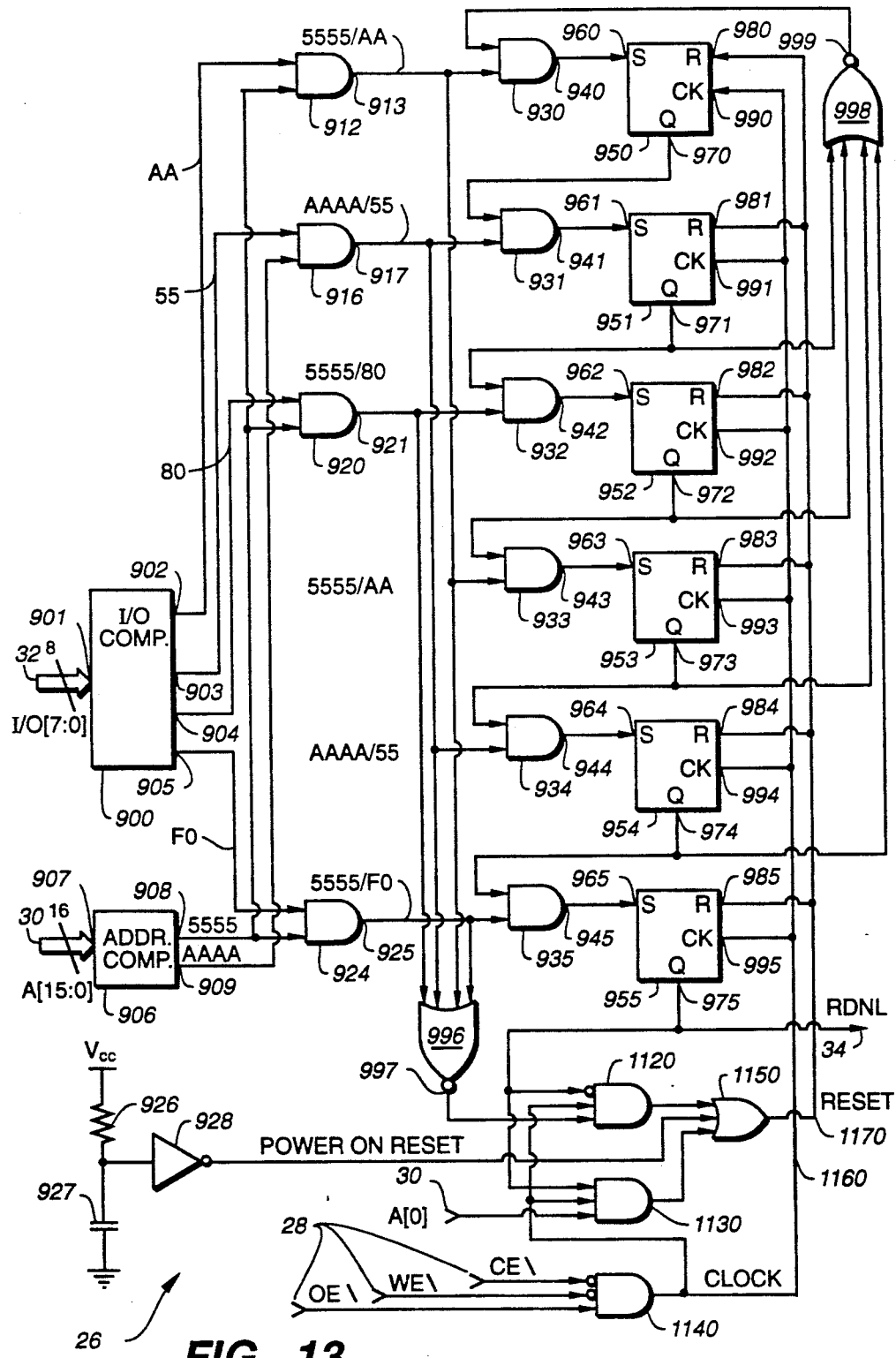
FIG._13

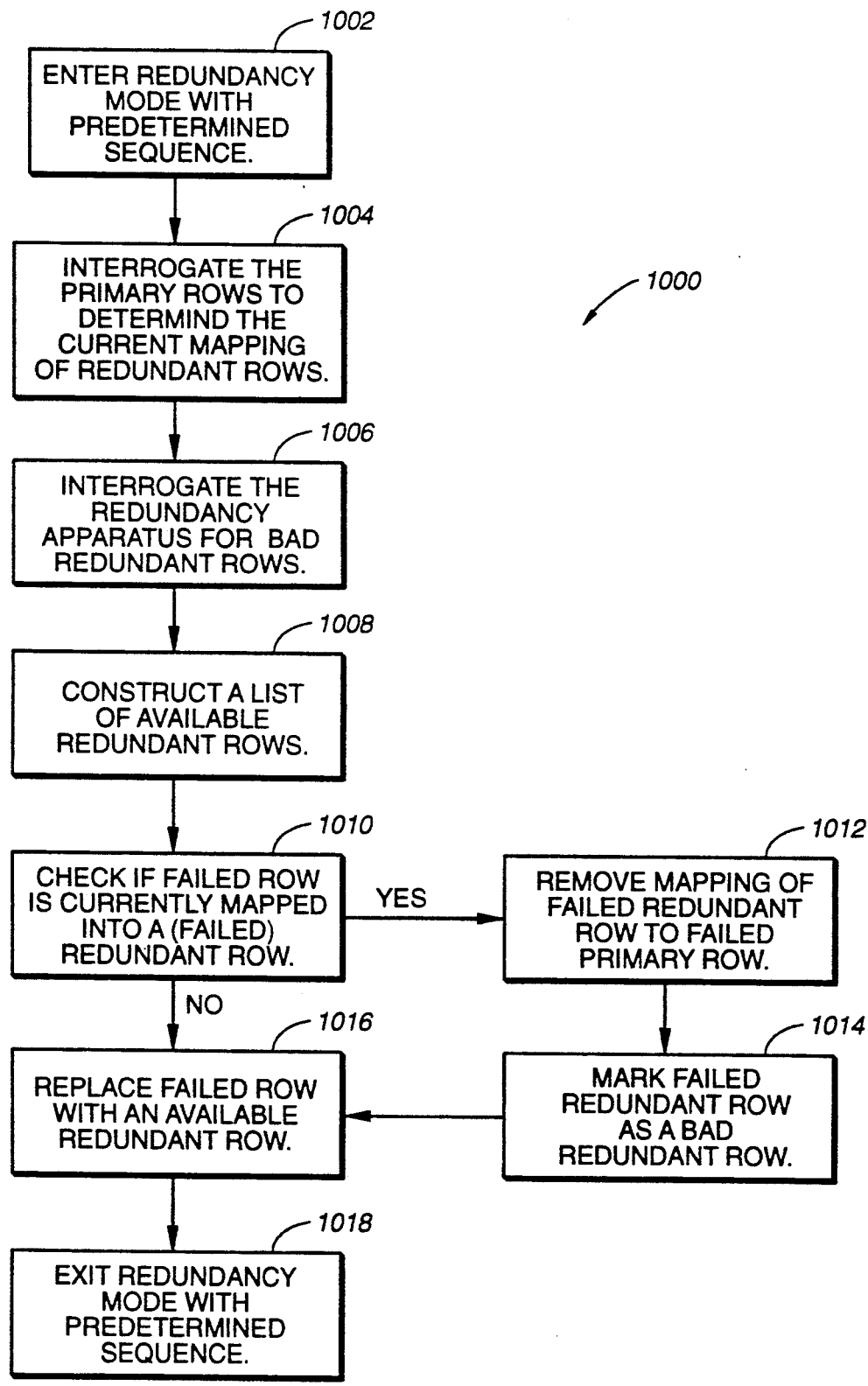
FIG._14

FIELD-PROGRAMMABLE REDUNDANCY APPARATUS FOR MEMORY ARRAYS

FIELD OF THE INVENTION

The present invention generally relates to integrated circuit semiconductor memory devices and electrically-erasable programmable read-only memory devices (EEPROM's). In particular, the present invention relates to a redundancy system for semiconductor memory devices which provides extra memory cells in each memory device which can be used to replace defective primary memory cells. More particularly, the present invention enables in-field programming and verification of such redundancy systems without the need for extra pins or other non-standard hardware or signals.

BACKGROUND OF THE INVENTION

The present invention builds upon two areas of prior art related to integrated circuit semiconductor memory devices. The first of these areas relates to redundancy techniques used in the manufacture of semiconductor memories to increase the yield of integrated circuit memory devices wherein a defective portion of each memory device can be replaced with extra, on-chip sections. In prior art redundancy systems, replacement of defective memory cells is done with the use of special signal lines and/or special voltages that are external to the memory device and that are not used during normal operation of the memory device in the field by the user. In the context of redundancy systems, the term memory cells refers to a particular grouping of data bits, such as data bits, data words, array rows, or array columns.

The second area relates to the industry standardization of various characteristics relating to random-access memory devices (RAM) and EEPROM devices. In order to facilitate the ready exchange of RAM and EEPROM devices made by different manufacturers, the electronics industry has instituted uniform standards for these devices regarding the signal-path organization and structure, package pin layout, logic types and corresponding voltage levels for signal lines, and timing constraints and requirements between signals. Also, not adding extra pins or high voltages eliminates the need for extra hardware in the external system.

The art from the first and second areas conflict with one another when they are applied simultaneously to a memory device. The special signals and voltages used for the replacement of primary memory cells with redundant memory cells are not included in the various industry standards. In other words, no special extra pins or voltages are provided for enabling these functions to be performed once the chip is installed in a standard printed circuit board socket, or the like. To resolve the conflict, manufacturers in the prior art have used the redundancy system only during the testing phase of manufacturing and disallow later user access to the redundancy system. Either the additional pins needed for the redundancy system are eliminated from the package pin layout, or the special pin voltages used are not disclosed to the user, resulting in the redundancy system being hidden from the user. The combination of these two areas, in effect, teaches against the development of user-controllable redundancy systems for semiconductor RAM and EEPROM devices.

To further understand the contributions of the present invention, the two above areas of prior art are explored in greater detail. The art in the area of redundancy concepts and techniques dates back to the 1960's when magnetic storage means such as magnetic discs and drums were the principle means of storing large amounts of digital data. The magnetic media used then, as well as the media used today, contained imperfections in the distribution of ferromagnetic material. The result was a number defective areas of the disc or drum which failed to retain a minimum level of magnetization.

The problem of defective areas was addressed by dividing the magnetic media into small elements called sectors. Each sector is tested for material imperfections with a series of read/write operations and a list of good and bad sectors is then constructed and stored in one or more predetermined sectors of the magnetic media. Upon applying power to the magnetic storage device in the field, the controller for the magnetic media would read these predetermined sectors and construct a mapping, or look-up table, between the linear address space seen by the user and the good sectors. The mapping information is held in faster memory means such as core memories or semiconductor memories. To access a byte of data, the controller must first examine the mapping to find the location of the sector which contains the byte of data before it can be accessed. Although this redundancy approach uses indirect addressing, it provides an acceptable level of performance because the access time through memory means holding the mapping information is much faster than the access time to the sector on the magnetic medium. Its success, however, relies on the integrity of the sectors holding the locations of good and bad sectors, as they cannot be replaced.

Redundancy techniques were later used in the early 1980's to improve the yields on high-density semiconductor memories. The indirect addressing approach used in the magnetic devices, although flexible, was generally not suitable for semiconductor memories since it doubled the access time of the memories. Instead, special programmable elements were added to the row and column decoding circuitry which enabled the decoding circuitry to map around a given number of defective rows and columns. Little or no delay was added to the access times for the devices using this redundancy approach.

Typically, fusible links, PROM elements, EEPROM elements, or laser-fusible conductive links were used, and continue to be used today, as the programmable elements. The programmable elements are designed so they will not be programmed by normal voltages and signals present in the memory device while the device is in the field. Specialized equipment employing high voltages, high-currents and/or laser beams is used to permanently program the programmable elements of the redundancy circuits during the manufacturing process. Often, extra signal lines are temporarily wired to specific locations in the decoding circuitry to facilitate the programming. The lines are later removed during the packaging phase of manufacturing. As such, the redundancy circuitry has been design to assure that the user cannot active them intentionally or inadvertently.

The additional voltage levels and signal lines of the specialized equipment, however, conflict with several industry standards covering signal-path organization, package pin configuration, voltage levels for signal lines, and timing constraints and requirements between signals. Each memory device typically holds a standardized number of bits, each bit holding a binary state of 1 or 0 for representing information. The memory size standard typically specifies a number of bits each to a integer power of two: $2^M$. Common memory sizes are 64k ($2^{16}$), 256k ($2^{18}$), and 1M ($2^{20}$) bits. In each memory, there are a specified number of address lines for selecting the bits, a specified number of data lines for exchange data between the selected bits and the outside system, and a specified number of control lines for controlling the exchange of data. As an example, FIG. 1 shows the signal lines, with the addition of power and ground lines $V_{cc}$ and $V_{ss}$, for a 256K-bit memory. The number of address lines and data lines will depend on the size and organization of the memory. Three control lines (chip enable, output enable, write enable) are commonly used for byte-wide ports as standardized by Joint Electron-Devices Engineering Council (JEDEC). All the address lines, data lines and control lines convey their respective signals with binary logic levels.

The organization of a memory device is usually defined so that a group of one, four or eight bits is selected at once by an address and the data contained in the group of bits is exchanged on one, four or eight corresponding data lines, respectively. For example, a 256K ($2^{18}$) device selecting 8 bits (byte) with each address would have an address space of 32k ($2^{15}$) addresses and eight data lines, one for each reference bit. For example, the Joint Electron-Device Engineering Council (JEDEC) standard currently specifies that the addresses start from zero and increase in integer increments, without gaps, up to the value of the address space, such that the number of external pins on the device is minimized. Additionally, the address lines as a whole encode each address in a binary representation and the number of address lines is kept at a minimum. For the 256K device with a 32K ($2^{15}$) by 8 bits ($2^3$) organization, the minimum number of address lines required to cover the 32K address space is fifteen. The address lines are denoted as A[14]-A[0] or A[14:0] and the data lines are denoted as I/O[7]-I/O[0] or I/O[7:0].

The control lines WE \ (write enable), CE \ (chip enable), and OE \ (output enable) control the operation of the memory device. These signals are presented to the memory device in complimentary form, which simplifies the design of the addressing circuitry of the system and increases its speed performance. The OE \ signal, when activated by a logic low, allows the I/O pins to exchange data with the system. When deactivated with a logic high, the OE \ control signal places the I/O pins in a high-impedance state (high-Z), which effectively removes the I/O pins from the system. By wiring together the corresponding I/O pins of several memory packages and by controlling the OE \ signals to only select one such memory, the system designer can use the OE \ signal to increase the amount of system address space by using more memory devices. The practice also leads to increased speed performance for the system. The CE \ also effectively disconnects the memory from the system when it is activated by a logic high and can be used to increase the system address space. In many products, the chip enable signal also reduces the power consumption of the memory chip while maintaining the integrity of the data in the memory. The WE \ control signal, in combination with the other control signals, governs the reading and writing of the memory. FIG. 2 shows the various combinations of these signals and the corresponding functional modes and status of the I/O lines.

FIG. 3 shows the pinout arrangement for two standard integrated circuit chip packages that are specified by the JEDEC standard. The standard also specifies that voltage between 0 V and 0.8 V be used to represent a logic low or zero at the pins and a voltage between 2.0 V and 5.0 V be used to represent a logic high or one at the pins.

To successfully read and write from a memory device, certain timing constraints between the address, data and control lines must be met. These constraints arise from the physical delays encountered as the corresponding signals propagate through the various circuits of the memory device. Over time, the number of constraints has increased and the relationships between constraints have become more complex as the timing schemes for these devices have evolved to increase the speed-performance for most prevalent of memory operations. For the purposes of this discussion, only the most basic and simple constraints are presented.

The JEDEC standards were instituted so that system designers could interchange memory devices from various suppliers without redesigning their circuits. Although these standards do not preclude the inclusion of a redundancy control system in standardized memory devices, they do not provide easy access to a redundancy control system so that a user is enabled to make repairs to standardized memory devices in the field.

SUMMARY OF THE INVENTION

Broadly stated, the present invention encompasses means for allowing the redundancy system of a memory device to be modified by software control while the memory device is installed in its parent system in the field.

The present invention is preferably contained in a single chip integrated circuit memory array which includes a plurality of primary memory cells, each primary memory cell for storing data, a plurality of redundant memory cells, each redundant memory cell for storing data, address means for enabling each of the primary memory cells to be accessed when a corresponding unique address is coupled thereto on a plurality of address lines, the address means using standard binary logic voltage levels when coupling the unique address onto the address lines, and read/write means for reading data from and for writing data to each primary memory cell on a plurality of data lines when the address of said primary memory cell is coupled to the address means, the read/write means using standard binary logic voltage levels for data states on the data lines.

Specifically, the present invention is a field-programmable redundancy system for enabling the integrated circuit memory array to temporarily enter a special redundancy or reconfiguration mode. In the reconfiguration mode, one of the primary memory cells may be replaced with an available one of the redundant memory cells such that data is exchanged by the read/write means with the redundant memory cell when the address of the replaced primary memory cell is coupled to the address means.

The present invention comprises means for detecting a predetermined code sequence on one or more of the address and data lines of the integrated circuit memory and means for causing the integrated circuit memory array to enter the reconfiguration mode when the predetermined code sequence is detected. It further comprises means responsive to the entry into the reconfiguration mode for disabling normal accessing of the primary memory cells by the address means and the read/write means and means during the reconfiguration mode for receiving the address of a selected primary memory cell to be replaced by a redundant memory cell and for identifying and selecting an available redundant memory cell to be used to replace the selected primary memory cell. Additionally, the present invention further comprises reconfiguration means responsive to said receiving means during the reconfiguration mode for replacing the selected primary memory cell with the selected redundant memory cell such that the selected redundant memory cell is thereafter accessed when the address of the selected primary memory cell is coupled to the address means. Lastly, the present invention further comprises means for causing the integrated circuit memory array to exit the reconfiguration mode.

The present invention further comprises a method for replacing a defective one of the primary memory cells with an available one of the redundant memory cells including the following steps: detecting a first predetermined code sequence on one or more of the address and data lines of the integrated circuit memory array; causing the integrated circuit memory array to enter a redundancy or reconfiguration mode of operation when the first predetermined code sequence is detected; identifying and selecting an available redundant memory cell in the reconfiguration mode; replacing the defective primary cell with the selected available redundant cell in the reconfiguration mode such that the selected redundant memory cell is accessed for data transfer on the data lines when the address of the defective primary memory cell is thereafter placed on the address lines; and causing the integrated circuit memory array to exit the reconfiguration mode of operation when a second predetermined code sequence is detected on one or more of the address and data lines.

Accordingly, it is an object of the present invention to allow the user to control the redundancy system of a memory array while the memory array is in field use without the need of additional pins on the chip package or non-standard voltage levels.

It is another object of the present invention to allow the user to replace faulty rows, words, bits, or columns in a memory array with corresponding redundant rows, words, bits or columns using standard signal-path pins, normal logic levels, and standard signals and timing constraints.

It is still another object of the present invention to allow the user to replace faulty redundant rows, redundant words, redundant bits or redundant columns of a memory with other corresponding redundant elements, thus protecting against failed redundant replacements, thereby further increasing system reliability.

It is yet another object of the present invention to increase the reliability and endurance of systems using integrated circuit memory arrays and EEPROM memory arrays by allowing these systems to repair memory arrays in the field without removing the memory arrays.

It is yet another object of the present invention to provide a user-controllable redundancy system on a single chip with the capability of determining which row, column, word or byte have already been replaced with a corresponding row, column, word or byte, which redundant rows, columns, words or bytes are available to be used as replacements, and to replace defective rows, columns, words or bytes with redundant rows, columns, words and bytes and to verify the replacements. These and other objects of the present invention will become apparent to those skilled in the art from the following detailed description of the invention and from the accompanying drawings.

BRIEF DESCRIPTION OF THE DRAWINGS

FIG. 1 shows the signal-path organization of a prior art 256K-bit memory array.

FIG. 2 is a table showing the combinations of the three standard control signals and the corresponding functional modes for the memory array of FIG. 1.

FIGS. 3A-3C shows the JEDEC standard for chip pin placement of a 256K-bit device with a byte-wide organization.

FIGS. 4A-4B shows a block diagram of an integrated circuit semiconductor memory array including a field-programmable redundancy apparatus according to the present invention.

FIGS. 5A-5B shows a table detailing the operation of the redundancy apparatus according to the present invention using signals on the address, data and control buses.

FIGS. 6A-6B shows a more detailed block diagram of the redundancy decoder shown in FIG. 4 according to the present invention.

FIG. 7 is a schematic of the redundant row decoder read/write controller shown in FIG. 6 according to the present invention.

FIG. 8 is a schematic diagram of the address-line buffer shown in FIG. 6 according to the present invention.

FIG. 9 is a more detailed block diagram of the redundant row decoder shown in FIG. 6 according to the present invention.

FIG. 10A is a circuit diagram of the NOVRAM compare cell shown in FIG. 9 according to the present invention.

FIG. 10B is a table of control signal states used in the read and write operations for the NOVRAM of FIG. 10A.

FIG. 11 is a circuit diagram of the NOVRAM bit cell shown in FIG. 9 according to the present invention.

FIG. 12 is a more detailed block diagram of the bit line combiner-selector according to the present invention as shown in FIG. 4.

FIG. 13 is a more detailed diagram of the redundancy mode detector according to the present invention as shown in FIG. 6.

FIG. 14 is a flow chart detailing the redundancy mode operations for replacing a primary row with a redundant row according to the present invention.

DETAILED DESCRIPTION OF THE INVENTION

A block diagram of an integrated circuit Semiconductor Memory Array including a Field-Programmable Redundancy Apparatus according to the present invention is shown at 10 in FIG. 4. The standardized control signal lines CE\, OE\, and WE\ are combined in a control bus 12. The standardized address lines A[15:0] are combined in an address bus 14 and the standardized data lines I/O[7:0] are combined in an I/O bus 16. The bracket notation for the address lines A[15:0], as with all bus signals used herein, indicates that there are sixteen lines from A[15] to A[0]. When the information on the bus is to be interpreted as a single binary number, the lowest numerical line corresponds to the least significant bit (LSB), e.g., A[0].

Control bus 12, address bus 14, and I/O bus 16 represent the signals required for controlling memory devices conforming to common industry and JEDEC standards. The standardized power lines $V_{CC}$ (+5 volts) and $V_{SS}$ (ground) are shown at lines 18 and 20, respectively. Included internally to the integrated chip are a 22 volt High Voltage Generator 22 and a 15 volt High Voltage Generator 24. High voltage generators 22 and 24 are used to program certain nonvolatile EEPROM cells within the field programmable redundancy apparatus, as described below. Their construction employs charge pumping techniques well known to the art. See, for example, U.S. Pat. Nos. 4,326,134 and 4,404,475.

Semiconductor Memory Array 10 has two modes of operation: a normal mode where Semiconductor Memory Array 10 is accessed for standard read and write operations and a redundancy mode, or reconfiguration mode, where the redundancy apparatus may be reconfigured. The field programmable redundancy apparatus contained in Semiconductor Memory Array 10 includes a Redundancy Mode Detector 26 which detects a predetermined sequence present on the signal lines that indicates the start of the redundancy mode. Redundancy Mode Detector 26 comprises a control bus input 28 to receive the standard control signals, an address bus input 30 to receive the standardized address line signals, and an I/O bus input 32 to receive the standardized data signals. As an output, Redundancy Mode Detector 26 provides signal RDNL at output port 34 to indicate that the redundancy mode sequence has been received. The RDNL signal is used throughout Semiconductor Memory Array 10 to toggle between the normal mode and redundancy mode operations.

Semiconductor memory array 10 further comprises a Primary Memory Array 36, which may contain, for example, 512K bits of information organized as 512 rows by 1024 columns. The columns may further be organized in eight groups with each group having 128 consecutive columns. Primary Memory Array 36 further includes Standard Read/Write Circuitry 37 known to the art which selects one of the 512 rows for reading or writing. Standard Read/Write Circuitry 37 of Primary Memory Array 36 is responsive to control signals supplied from a standard Read/Write Control 70 via a read/write control bus port 48. Standard Read/Write Circuitry 37 of Primary Memory Array 36 is further responsive to a row select bus 68 generated from a Primary Decoder 60 and received by row select bus port 38. The signals at row select bus port 38 select only one of the 512 rows in primary memory means 36 during any given memory accessing operation. The column groups are output from Primary Memory Array 36 via bit line group outputs 40–47, which are tied to eight respective bit line groups 50–57.

Standard Read/Write Control 70 is responsive to the control signals contained in control bus 12 and the additional internally generated control signal RDNL. The control signals are received at a control bus port 72 and the complement of redundant signal RDNL is generated by inverter 73 and provided to Read/Write Control 70 via an enable port 74. Read/Write Control 70 generates a number of control signals well known in the art and transmits the signals on a read/write control bus 76.

When Semiconductor Memory Array 10 enters the redundancy mode, signal RDNL becomes active and, via inverter 73 and enable port 74, disables Read/Write Control 70. When Semiconductor Memory Array 10 exits the redundancy mode, signal RDNL is deactivated and, by inverter 73, Read/Write Control 70 is then re-enabled.

Primary Decoder 60 is coupled to address bus 14 via address bus port 62 and coupled to control bus 12 via control bus port 64. Primary Decoder 60 uses address lines A[15:7] to generate a signal on a selected one of 512 signal lines which are coupled out onto row select bus 68 to Primary Memory Array 36. Primary Decoder 60 is responsive to an enable signal which is presented at an enable port 66. The enable signal is generated via inverter 65 by a signal MTCHONE, which indicates that a redundant row contained in a Redundant Memory Array 86 should be accessed for the row address indicated on address lines A[15:7] rather than a row in Primary Memory Array 36. Signal MTCHONE is generated from a Redundancy Decoder 100 to be discussed below. The enable signal presented at enable port 66 of Primary Decoder 60 will enable Primary Decoder 60 to select a row in the primary array when a redundant row is not used, and to disable all rows in the primary array when a given redundant row is used in place of the primary row during a memory read or write operation.

Integrated circuit Semiconductor Memory Array 10 further comprises a Redundant Memory Array 86 which in the present embodiment contains 8K bits of information organized as 8 rows by 1024 columns. Each column in the present embodiment is further organized as 8 groups, each group containing 128 consecutive columns. The groups are coupled to bit-line group ports 90–97, respectively. In turn, bit-line group ports 90–97 are coupled to bit-line groups 50–57, respectively. In the layout implementation of Semiconductor Memory Array 10, the placement and structure of Primary Memory Array 36, Redundant Memory Array 86 and bit-line groups 50–57 are such that the individual bit lines in bit-line groups 50–57 parallel one another and run continuously, in one direction, through the layouts of Primary Memory Array 36 and Redundant Memory Array 86.

Redundant Memory Array 86 further comprises Standard Read/Write Circuitry 87 well known to the art. Standard Read/Write Circuitry 87 is responsive to a set of control signals provided by standard Read/Write Control 70 and read/write control bus 76 and coupled to Redundant Memory Array 86 via a read/write control bus port 98. Redundant Memory Array 86 is further responsive to a row select bus 112 which is received at a row select bus port 88. The row select bus port 88 contains a decoded signal which chooses one of the eight rows contained in Redundant Memory Array 86.

Semiconductor memory array 10 further includes a Redundancy Decoder 100 which provides the one of eight row select signals to Redundant Memory Array 86 via row select bus 112. Redundancy Decoder 100 is responsive to address bus 14 via address bus port 102, to control bus 12 via control bus port 106, and to the redundancy-mode signal RDNL generated from Redundancy Mode Detector 26 via port 104. Redundancy Decoder 100 further comprises eight storage locations for storing the identity of up to eight rows in Primary Memory Array 36. Each of the storage locations corresponds uniquely to one of the eight redundant rows. To replace a primary row with a redundant row, the identity or address of that primary row which is to be replaced is entered into one of the eight storage locations in the Redundancy Decoder 100. As mentioned above, a given row's address is entered on address lines A[15:7].

In normal operation of Memory Array 10, Redundancy Decoder 100 continually checks address lines A[15:7] on address bus 14 for a match between the row address specified on address bus 14 and any one of the storage locations within Redundancy Decoder 100. Any matching row address is coupled out onto a redundant row match bus 108 which contains eight lines, one for each storage location. The eight lines from the redundant row match bus 108 are logic OR'ed together by an OR gate 199 into one signal which is labeled MTCHONE. Signal MTCHONE is used by Primary Decoder 60 via inverter 65 and enable port 66 to disable the selection of rows in Primary Memory Array 36 when Redundancy Decoder 100 has detected a row address match condition. Once the Primary Memory Array 36 is disabled, Redundancy Decoder 100 selects the proper row in Redundant Memory Array 86 by activating the proper row select line on row select bus 112.

As mentioned above, Semiconductor Memory Array 10 has a normal mode where the memory arrays are accessed for standard read and write operations and a redundancy mode where the redundancy apparatus may be re-configured. The redundancy mode is also known as the reconfiguration mode. When in the redundancy mode, the row storage locations of Redundancy Decoder 100 may be programmed. The programming of the row storage locations is done exclusively through address lines A[15:0] of address bus 14. Also, the current status and addresses of the row storage locations may be output to I/O bus 16 in the redundancy mode. Redundancy Decoder 100 provides this status information via redundant row match bus 108 and a redundant row disable bus 110. Match bus 108 and disable bus 110 each contain eight signals, which are routed to a Bit-Line Combiner-Selector 200 to be output to I/O bus 16. A more detailed description of the operation of Redundancy Decoder 100 during normal memory access operation and during redundancy mode operation is given below.

Semiconductor memory array 10 further includes a Bit-Line Combiner-Selector 200 which enables the input or output of data from Memory Arrays 36 and 86 during the normal mode and the output of Redundant Array 86 status information from Redundancy Decoder 100 in the redundancy mode. In normal operation, Bit-Line Combiner-Selector 200 is responsive to address bus 14 via address bus port 208 and is coupled to the bit-line groups 50–57 via bit-line group ports 210–217, respectively. Address lines A[6:0] of address bus 14 are used to select one of the 128 bits from each of the bit-line groups 50–57. The selected bits are coupled on bit ports 220–227, respectively, for the requested read or write operation.

The combination of Bit-Line Combiner-Selector 200, Data Bus 16, Control Bus 12, standard Read/Write Control 70, standard Read/Write Circuitry 37 constitutes a read/write means for reading data from and writing data to each of the memory cells in Primary Memory Array 36. The addition of standard Read/Write Circuitry 87 constitutes read/write means for reading data from and writing data to all memory cells in Semiconductor Memory Array 10. In a similar manner, the combination of Address Bus 14 and Primary Decoder 60 constitutes an address means for enabling each of the primary cells in Primary Memory Array 36 to be accessed by the read/write means when a corresponding unique address is coupled to Address Bus 14. The addition of Redundancy decoder 100 constitutes such an address means for enabling access to all cells in Semiconductor Memory Array 10.

In redundancy-mode operation, Bit-Line Combiner-Selector 200 outputs status information from Redundancy Decoder 100. A redundant-row disable bus RDNDIS[7:0] from Redundancy Decoder 100 indicates which of the eight redundant rows are disabled and is coupled in from a port 204. A redundancy match bus RDNMTCH[7:0] from Redundancy Decoder 100 indicates which row in Redundant Memory Array 86, if any, is to be used for the row address present on address lines A[15:7] and is coupled in from a port 206. The MTCHONE signal from OR gate 199 indicates if any one of the redundant rows matches the row address on address lines A[15:A7] and is coupled in from a port 207. Bit-Line Combiner-Selector 200 uses the redundancy mode signal RDNL to select between the normal and redundancy operations and is coupled in via port 202 and uses address lines A[6:0] to select data from the redundancy status signals RDNDIS[7:0], RDNMTCH[7:0] and MTCHONE. A further description of the operation of Bit-Line Combiner-Selector 200 is given below.

With regard to the broadest elements of the present invention, Redundancy Mode Detector 26 provides a means for detecting a predetermined code sequence on one or more of the address and data lines that is used to enter the redundancy mode. The activation of redundancy mode signal RDNL and by Redundancy Mode Detector 26 and the coupling of RDNL to Redundancy Decoder 100, Bit-Line Combiner/Selector 200, Primary Decoder 60, and Standard Read/Write Control 70 constitute means for causing integrated circuit Semiconductor Memory Array 10 to enter the redundancy mode when the predetermined code sequence is detected. Additionally, Redundancy Mode Detector 26 comprises means for causing Semiconductor Memory Array 10 to exit the redundancy mode. The generation of the enable signal at port 66 of Primary Decoder 60 from the RDNL signal provides for disabling the normal accessing of primary memory cells by the address means and read/write means during the redundancy mode. Means for receiving the address of a selected primary memory cell to be replaced and for identifying and selecting an available redundant memory cell for the replacement are provided by Redundancy Decoder 100 and Bit-Line Combiner/Selector 200. Redundancy Decoder 100 also provides the reconfiguration means for replacing a selected primary memory cell with a selected redundant memory cell.

The various normal-mode and redundancy-mode operations available in Semiconductor Memory Array 10 are shown by a Signal Line Control Table 300 in FIG. 5. Signal Line Control Table 300 contains nine rows, the first row, shown at 301, is a legend which identifies the specific control, address and data signals being illustrated, and the remaining eight show the various operations according to the present invention. Signal Line Control Table 300 contains four basic columns: a mode-flag column, a Chip Control Bus column, an Address Bus column, and a Data Bus column. Each of these columns shows the status of information on the corresponding path for the various operations. An H symbol indicates a high state (~5 V), an L symbol indicates a low state (~0 V), and an X indicates a "don't care" state.

In the normal mode, there are usually two possible memory array operations: a Standard Read Operation, shown at 302 of FIG. 5, and a Standard Write Operation, shown at 303 of FIG. 5. For these operations, the redundancy mode flag RDNL is low indicating the normal mode. The chip control path signals select a given memory array for memory access and control whether a read or write operation is performed in the selected memory array. Thus, when Semiconductor Memory Array 10 is selected, the CE\ signal is low for both Standard Read Operation 302 and Standard Write Operation 303. For Standard Read Operation 302, the OE\ signal is low and the write enable signal WE\ is high. For Standard Write Operation 303, the output enable signal OE\ is high and the write enable signal WE\ is low. For both Operations 302 and 303 in the normal mode, the address bus contains the address of the byte which is to be either read or written to. For the Standard Read Operation 302, the data bus contains the byte that is being read from Semiconductor Memory Array 10. During the Standard Write Operation 303, the data bus contains the byte to be written into Semiconductor Memory Array 10.

In the redundancy mode, there are six possible operations: (1) a Read Redundant Row ID operation, shown at 304, wherein the output is the identity of which redundant row, if any, has replaced a given primary row; (2) a Read Bad Redundant Row Status operation, shown at 305, wherein the output is the identity of those redundant rows in Redundant Memory Array 86 which have been flagged as being bad; (3) a Program Redundant Row Address operation, shown at 306, wherein a given primary row found to be bad is replaced with a selected redundant row; (4) a Reset Redundant Row Address operation, shown at 307, wherein a redundant row replacement operation is nullified; (5) a Mark Bad Redundant Row operation, shown at 308, which sets an internal flag indicating that a given redundant row is non-functional; and (6) an Exit Redundancy Mode operation, shown at 309, which returns Semiconductor Memory Array 10 to the normal mode. All of the above described redundancy mode operations involve the exchange of information stored in nonvolatile memory cells contained in Redundancy Decoder 100.

During the redundancy mode operations, mode flag RDNL remains in a high state, indicating the redundancy mode. In the chip control bus, the chip enable signal CE\ is low indicating that the chip is selected. For the first two redundant read operations shown at 304 and 305, the output enable signal OE\ is low, and the write enable signal WE\ is high. For the four remaining redundant write operations shown at 306-309 of FIG. 5, the output enable signal OE\ is high and the write enable signal WE\ is low. The configuration of control signals for the read operations at 304 and 305 are identical to the Standard Read Operation 302 and the configuration of control signals for the program operations shown at 306-309, in the redundancy mode are the same as that for Standard Write Operation 303.

To determine which rows in Primary Memory Array 36 have been replaced by rows in the Redundant Memory Array 86, according to the preferred embodiment, the user sequences through each primary row to determine if a redundant row is associated with that primary row. This sequencing is performed by the Read Redundant Row ID operation 304 shown in FIG. 5. In the address bus, the user provides the address of the primary row on address lines A[15:7] and a predetermined binary code on address lines A[6:0] equal to a decimal value of 126. If a redundant row has been used to replace the particular primary row given, then the match signal on data line I/O[3] on I/O bus 16 will contain a logic high value and the row ID of the redundant row will be encoded in the three data lines I/O[2:0].

To determine if a particular redundant row is in functional condition, the Read Redundant Row Status operation 305 shown in FIG. 5 is performed. In this operation, the user supplies a predetermined code on address lines A[6:0] equal to a decimal value of 127 and then reads out the row status information from the I/O bus 16. The information on the row status is not encoded on these lines. In other words, the status of each of the eight redundant rows is output at the same time with each redundant row's status allocated to a different one of the eight bit lines on the I/O bus 16. For example, I/O[0] provides the row status of redundant row O, and so forth. A logic high value on a given I/O data line in this mode represents a non-functioning condition for the corresponding redundant row.

A row in Primary Memory Array 36 may be replaced by a row in Redundant Memory Array 86 with the Program Redundant Row Address Operation 306 shown in FIG. 5. In this operation, during the redundancy mode the user supplies the address of the primary row to be replaced on address lines A[15:7], the row number of the redundant row to be used on address lines A[6:4], a predetermined code on address lines A[3] and A[2] of logic low and logic high respectively, and a logic low on address line A[0]. Address line A[1] and I/O lines I/O[7:0] are not used in this operation.

To undo or nullify a previous replacement of a row in Primary Memory Array 36 by a redundant row in Redundant Memory Array 86, the Reset Redundant Row Address operation 307 shown in FIG. 5 is used. In this operation, the row number of the redundant row in Redundant Memory Array 86 is supplies on address lines A[6:4] in encoded form along with a predetermined code on address lines A[3] and A[2] both equal to a logic low, and a logic low on address line A[0]. The remaining address lines and the data I/O lines are not used for this operation.

To mark a redundant row as being in nonfunctional or bad condition, the Mark Bad Redundant Row operation 308 shown in FIG. 5 is used. In this operation, the row number of the redundant row to be marked is supplied in encoded form on address lines A[6:4] along with a logic high on address line A[3] and a logic low value on address line A[0]. The remaining address lines and the data I/O lines are not used in this operation. The user must determine whether a redundant row is in functioning condition by first mapping it into a primary row address while in redundancy mode and then performing standard read/write test operations to the redundant row during normal mode.

To exit the redundancy mode, the Exit Redundancy Mode operation 309 shown in FIG. 5 is used. In this operation, all address lines are set high and the data I/O lines are not used. Address line A[0] is used to distinguish this operation from other redundancy program operations so as not to disturb any previously programmed redundancy mapping information.

Redundancy Decoder 100 of Semiconductor Memory Array 10, shown in FIG. 4, provides the means for performing the redundancy mode operations detailed in FIG. 5 and is a key aspect of the present invention. A more detailed block diagram of Redundancy Decoder 100 is shown in FIG. 6. Redundancy Decoder 100 comprises eight Redundant Row Decoders 120-127, each of which are responsive to address signals provided by an Address Line Buffer 178, control signals provided by a Redundant Row Decoder Read Write Controller 128, and a redundancy write enable signal provided by a 3-to-8 Decoder 186.

Each Redundant Row Decoder 120-127 corresponds uniquely to a redundant row in Redundant Memory Array 86. Each Redundant Row Decoder 120-127 comprises storage means for storing the address of a row in primary memory means 36, a bit storage location used to indicate whether the redundant row which corresponds to the Redundant Row Decoder is currently being used, and an additional bit storage location for indicating whether the redundant row which corresponds to the Redundant Row Decoder is bad, i.e., non-functional in some respect.

Each Redundant Row Decoder 120-127 produces two signals: a signal indicating a match of a primary memory row address (RDNMTCH) and a signal indicating whether the corresponding redundant row is bad (RDNDIS). Note that an RDNMTCH signal will not be generate by a given Redundant Row Decoder unless the "used" bit indicates the redundant row is being used. The redundant row match signals RDNMTCH[0:7] from Redundant Row Decoders 120-127 appear at primary row match ports 170-177 respectively, and the bad row indications RDNDIS[0:7] from Redundant Row Decoders 120-127 appear at disable row ports 160-167, respectively. The address lines from Address Line Buffer 178 are coupled to the Redundant Row Decoders 120-127 via address bus ports 130-137, respectively, and the control signals RDNCTL[0:4] from Redundant Row Decoder Read/Write Controller 128 are coupled to Redundant Row Decoders 120-127 via R/W control ports 140-147, respectively. The redundant write enable signals for each Redundant Row Decoder 120-127 are denoted as RDNWE[0:7] and are generated individually from 3 to 8 Decoder 186 via lines 190-197 which are coupled to Redundant Row Decoder 120-127, respectively.

Address Line Buffer 178 generates three groups of address signals from address lines A[15:0] provided by address bus 14 as received by address bus port 102. Address Line Buffer 178 provides a buffered replica of the address signals A[15:0] present at address port 102 at port 181 indicated as ABUF[15:0]. With the aid of a source of high voltage provided at port 180, Address Line Buffer 178 generates a set of high voltage level address signal lines AHV[15:0] at port 182. The high voltage version of the complements of the address line signals AHV\[15:0] are output at port 183. The buffered address line signals ABUF [15:0] at port 181 preferably have a voltage of near 5 volts to indicate a logic high and a voltage near zero volts to indicate a logic low. The high voltage versions of the address lines and their complements preferably have a voltage of 15 volts to indicate a logic high and a voltage near zero volts to indicate a logic low. The high voltage signals at ports 182 and 183 are used to program nonvolatile memory elements present in Redundant Row Decoders 120-127 to be detailed below. Address Line Buffer 178 receives the high voltage at port 180 from High-Voltage Generator 24 shown in FIG. 4.

Decoder 186 is responsive to address lines A[6:4] of address bus 14 coupled thereto at port 188 and decodes the three signal lines present in A[6:4] by activating only one of Decoder 186's output select ports 190-197 in response to any given code on these address lines. Decoder 186 is further responsive to an enable signal present at enable port 187. This enable signal is generated by the ANDing of the RDNL signal, the uncomplemented version of chip enable signal CE\, and the compliment of address line A[0] by an AND gate 189. The RDNL signal is input to Redundancy Decoder 100 at port 104, the chip enable signal CE\ is input at port 106 and is inverted at the input by AND gate 189 as indicated by the bubble symbol, and the address line A[0] is input at port 102 and inverted at the input by AND gate 189 as indicated by the bubble symbol. The enable signal at enable port 187 will only allow decoder 186 to generate the select signal on select ports 190-197 when a logic high signal is output by AND gate 189. The select signals on select ports 190-197 are used only during the redundancy mode when information is to be written to one of the Redundant Row Decoders 120-127. The particular redundancy mode program operations involved are shown at 306-308 of FIG. 5. In redundant row operations 306-308 of FIG. 5, note that redundant flag RDNL is always high, address line A[0] is low, and that address lines A6-A4 carry the row ID of the redundant row.

The signals used to control the reading and programming of the nonvolatile storage means contained in Redundant Row Decoders 120-127 are generated by Redundant Row Decoder Read/Write Controller 128. Read/Write Controller 128 is responsive to the redundancy mode signal RDNL presented at port 104 and to the standard read/write and chip enable signals provided by control bus 12 and presented at control bus port 106. Read/Write Controller 128 generates five control signals RDNCTL[0:4] which are output at port 129 to a read/write control bus 139. In turn, read/write control bus 139 is coupled individually to Redundant Row Decoders 120-127 at read/write control ports 140-147, respectively. Read/write control bus 139 contains the following five control signals: SWRT\, AGRDN, PIRDN, RWRT, and VCCSWT, and are identified as a group as the RDNCTL[0:4] control signals. The operation of these signals will be described in greater detail below.

Redundant Row Decoder Read/Write Controller 128 of Redundancy Decoder 100 is shown in greater detail in FIG. 7. In Read/Write Controller 128, the RDNL signal is received at port 104 and the standard chip enable CE\, output enable CE\, and write enable WE\ signals are received at control bus port 106 from control bus 12, shown in FIG. 4. Three inverters 320, 322 and 324 are used to generate the uncomplemented versions of the chip enable signal CE\, the output enable signal OE\, and the write enable signal WE\, respectively. The RDNL signal from port 104, the chip enable signal CE from the output of inverter 320, the output enable signal OE\ from port 106, and the write enable signal WE from inverter 324 are coupled to a NAND gate 326. NAND gate 326 provides an output at 327 which provides the SWRT \ signal to the read/write control bus 129 as signal RDNCTL[0]. NAND gate output 327 is also fed to an inverter 328 to produce an output 329 which determines the signal AGRDN, which is fed out to control bus 129 as signal RDNCTL[1]. The inverter output 329 is further fed into the inputs of two inverters 330 and 332. Inverter 330 generates an output 331 which carries control signal PIRDN to control bus 129 as signal RDNCTL[2]. The control signal RWRT is generated with a circuit combination of the output of inverter 332, a high voltage transistor 334, and a High Voltage Line Coupler 336.

The output of inverter 332 is coupled to the gate of high voltage transistor 334, and the source of high voltage transistor 334 is coupled to ground. High Voltage Line Coupler 336 receives a high voltage of 22 volts from the output of High Voltage Generator 22 via high voltage port 337, and couples out a high impedance version of the 22 volts to output port 338. Output port 338 is in turn coupled to the drain of high voltage transistor 334 to produce the control signal RWRT. When the output of inverter 332 is low, high voltage transistor 334 is in a non-conducting state and signal RWRT is allowed to rise to 22 volts through the action of High Voltage Line Coupler 336. When the output of inverter 332 is high, transistor 334 is in a conducting state and the drain of high voltage transistor 334 pulls the signal line RWRT to a low level. Signal RWRT is coupled to read/write control bus 129 as signal RDNCTL[3]. Due to the high impedance isolation provided by High Voltage Line Coupler 336, output port 338 can be brought low by transistor 334 without disturbing or loading down the high voltage presented at high voltage port 337. Typically, High Voltage Line Coupler 336 includes a pass transistor coupled between the high voltage source and output port 338 to limit the current delivered to the output and a sense transistor which monitors the voltage on output port 338 and controls the current flow through the pass transistor. An exemplary high voltage line coupler may be found in U.S. Pat. No. 4,617,652.

The last control signal, VCCSWT, is generated from a conventional 50 microsecond Delay Unit 340 at output port 343. Delay Unit 340 is responsive to the standard supply power $V_{CC}$ via port 341 and to ground via port 342. Delay Unit 340 samples voltage $V_{CC}$ during power up and activates signal VCCSWT 50 microseconds after power supply $V_{CC}$ has reached 90% of its final value. Delay Unit 340 is well known in the art and may be constructed, for example, from an RC delay circuit, a comparator, and a voltage reference.

Address Line Buffer 178 of Redundancy Decoder 100 is shown in greater detail in FIG. 8. Address Line Buffer 178 comprises sixteen separate buffer units 360–376, one buffer unit for each address line in address bus 14. For a more compact presentation, only the operation of buffer unit 360 will be described in detail as the construction of buffer units 361–376 is identical to that of buffer unit 360. Buffer unit 360 is responsive to address line A[15] of address bus 14 and is received through address bus port 102 of Redundancy Decoder 100, as shown in FIG. 4. Address line A[15] is coupled from address bus port 102 to an inverter 386, which generates a complemented output at inverter output 387. Inverter output 387 is further coupled to an inverter 394, which produces a buffered address signal ABUF[15] at port 181.

Inverter output 387 is also coupled to the gate terminal of a high voltage transistor 388. High voltage transistor 388, in combination with a High Voltage Line Coupler 390, is used to generate a high voltage version of address line A[15] at port 182. High voltage transistor 388 has a source terminal coupled to ground and a drain terminal coupled to port 182. High Voltage Line Coupler 390 has a high voltage port 391 for receiving a high voltage signal of 15 volts from High Voltage Generator 24 shown in FIG. 4 via high voltage port 180 of Address Line Buffer 178, and a high impedance coupler output 392 which is coupled to the drain of high voltage transistor 388. When the gate terminal of high voltage transistor 388 is low, high voltage transistor 388 does not conduct and the high voltage address line signal AHV[15] is brought to 15 volts by High Voltage Line Coupler 390. When the gate of high voltage transistor 388 is high, high voltage transistor 388 conducts which brings down the voltage on address line AHV[15] to near zero. The high impedance isolation provided by High Voltage Line Coupler 390 prevents the conduction of high voltage transistor 388 from loading down the high voltage signal at port 391.

Address line A[15] at address bus port 102 is further coupled to a gate terminal of a high voltage transistor 380. High voltage transistor 380, in combination with a High Voltage Line Coupler 382, provides a complemented high voltage address line signal AHV [15] to port 183. High voltage transistor 380 and High Voltage Line Coupler 382 function in a similar manner as high voltage transistor 388 and High Voltage Line Coupler 390. The source of high voltage transistor 380 is coupled to ground and the drain of transistor 380 is coupled to the output port 183 and port 384 of High Voltage Line Coupler 382. Line coupler 382 also receives its high voltage signal of 15 volts from High Voltage Generator 24, shown in FIG. 4, which is received at high voltage port 383 via High Voltage Port 180 of Address Line Buffer 178.

An exemplary Redundant Row Decoder, as at 120 in Redundancy Decoder 100 of FIG. 6, is shown in greater detail in FIG. 9. As stated previously, Redundant Row Decoder 120 comprises storage means for storing the address of a primary row, storage means for storing the bad row status for this Decoder's corresponding redundant row, and storage means for storing whether the corresponding redundant row is currently being used as a replacement row. The means for storing the address of the primary row being replaced by this redundant row comprises nine NOVRAM Compare Cells 400–408. The means for storing the bad redundant row status comprises a NOVRAM Bit Cell 500. Lastly, the storage means for indicating the redundant row use status comprises a NOVRAM Bit Cell 520. In the normal mode of operation of Semiconductor Memory Array 10, NOVRAM Compare Cells 400–408 sample address lines ABUF[15:7] at port 181 at their respective ports 450–458.

Provided that an address of a primary row has been previously programmed into NOVRAM Compare Cells 400–408, each NOVRAM Compare Cell 400–408 will report a match at their respective output ports 410–418 as signal lines BITMTCH\[8:0]. The bit match signals BITMTCH\ [8:0] are provided in complementary form and are OR'ed together by a NOR gate 560 to produce a redundancy row match signal RDNMTCH[0] at port 170. The redundancy row match signal RDNMTCH[0] reports a match only if all the bit match signals BITMTCH\[8:0] are low, indicating that the primary row address present on address lines A[15:7], via buffered address lines ABUF[15:7], equals the row address programmed into NOVRAM cells 400–408. Additionally, NOR gate 560 uses information from NOVRAM Bit Cell 520 which stores the redundant row use status information and from NOVRAM Bit Cell 500 which stores the bad redundant row status information.

Specifically, NOVRAM Bit Cell 520 provides a complementary "used" signal at port 532 which is fed into the tenth input of NOR gate 560. The "used" signal from port 532 functions in the same manner as any one of the bit match signals and will prevent a match signal at port 170 if Redundant Row Decoder 120 has not yet been programmed as a replacement for a bad primary row, or if it has been programmed into a disabled state by the Reset Redundant Row Address operation 307, shown in FIG. 5, described above. NOVRAM bit Cell 500 provides a disable signal at port 512 which is fed into the eleventh input of NOR gate 560. The disable signal is programmed to a logic high in Mark Bad Redundant Row Operation 308 if the correspond redundant row of Redundant Row Decoder 120 has been found to be nonfunctional. The disable signal from port 512 functions in the same manner as any one of the bit match signals and will prevent a match signal at port 170 if Redundant Row Decoder 120 has been marked as a bad redundant row.

NOVRAM Compare Cells 400-408, as well as NOVRAM Bit Cells 500 and 520, are programmed during the redundancy mode by means of the redundant control signals RDNCTL [4:0], which are input at port 140 from Read/Write Controller 128, the redundancy write enable signal RDNWE[0] at port 150 from 3 to 8 Decoder 186, and an internally generated signal REXWL, which is derived from the redundancy write enable signal RDNWE[0]. NOVRAM Compare Cells 400-408 receive the redundancy control signals RDNCTL[4:0] at their respective ports 440-448, and NOVRAM Bit Cells 500 and 520 receive the RDNCTL[4:0] signals at their respective ports 506 and 526. NOVRAM Compare Cells 400-408 receive the redundancy write enable signal RDNWE[0] at their respective ports 430-438 and NOVRAM Bit Cells 500 and 520 receive the RDNWE[0] signal at their respective ports 504 and 524. NOVRAM Compare Cells 400-408 receive the internally generated REXWL signal at their respective ports 420-428 and NOVRAM Bit Cells 500 and 520 receive the REXWL signal at their respective ports of 502 and 522.

The REXWL signal is derived from the circuit combination of an inverter 540, a high voltage transistor 542, and High Voltage Coupler 550. The redundancy write enable signal RDNWE[0] is coupled to the input of inverter 540. The output of inverter 540 is coupled to the source terminal of high voltage transistor 542. The SWRT signal contained in the RDNCTL[4:0] redundancy control bus is tapped out at junction 555 and coupled to the gate of high voltage transistor 542. The drain of high voltage transistor 542 is coupled to the high impedance output 552 of High Voltage Coupler 550. High Voltage Coupler 550 derives power from High Voltage Generator 22 shown in FIG. 4 at port 551. The REXWL signal is formed at the junction of the high impedance output 552 and the drain of high voltage transistor 542. REXWL is a high voltage when control signal SWRT \ is low, thereby shutting off high voltage transistor 542. The REXWL signal is low only when the control signal SWRT \ is high, which allows high voltage transistor 542 to conduct, and when redundancy write signal RDNWE[0] is high, which couples ground to the source of high voltage transistor 542.

NOVRAM Compare Cells 400-408 and NOVRAM Bit Cells 500 and 520 are programmed with the aid of the previously described redundancy control signals RDNCTL[4:0], RDNWE[0], and REXWL, and the high voltage address signals AHV \ [15:0] and AHV[15:0], the latter two being provided by ports 183 and 182 respectively of Address Line Buffer 178. NOVRAM cells 400-408 are each coupled to one of the high voltage address lines AHV[15:7] at their respective ports 460-468 and each are coupled to one of the complemented high voltage address lines AHV\[15:7] at their respective ports 470-478. NOVRAM Bit Cell 500, which stores the bad redundant row status of the redundant row corresponding to Row Redundant Decoder 120, is coupled to the high voltage address line AHV[3] at port 508 and is coupled to the complemented high voltage signal AHV \ [3] at port 510. NOVRAM Bit Cell 520, which stores the redundant row use status of the redundant row corresponding to Redundant Row Decoder 120, is coupled to the high voltage address line AHV[2] at port 528 and to the complemented high voltage address line AHV \ [2] at port 530.

During programming operations in the redundancy mode, for example operations 306-308 shown in FIG. 5, NOVRAM Compare Cells 400-408 and NOVRAM Bit Cells 500 and 520 are programmed simultaneously. During the Program Redundant Row Address Operation 306 shown in FIG. 5, the primary row address to be replaced by the redundant row corresponding to Redundant Row Decoder 120 is programmed into NOVRAM Compare Cells 400-408. In this operation, a low state is programmed into NOVRAM Bit Cell 500 to indicate that the row is in good condition, and a high state is programmed into NOVRAM Bit Cell 520 to indicate that the redundant row is now being used. During the Reset Redundant Row Address operation 307 shown in FIG. 5, no information is programmed into NOVRAM cells 400-408, a low state is programmed into NOVRAM Bit Cell 500 to indicate that the redundant row is still functional, and a low state is programmed into NOVRAM Bit Cell 520 to indicate that the redundant row corresponding to Redundant Row Decoder 120 is not being used. For the Mark Bad Redundant Row operation 308 shown in FIG. 5, no information is programmed into NOVRAM Compare Cells 400-408, a high state is programmed into NOVRAM Bit Cell 500 to indicate the row is non-functional (bad), and no information is programmed into NOVRAM Bit Cell 520. This status information is later read out with the redundancy read Operations 304 and 305 so that the user can determine the mapping of redundant row to primary rows, the used redundant rows, and the bad redundant rows.

An exemplary NOVRAM Compare Cell, as at 400 in Redundant Row Decoder 120 (FIG. 9), is shown in more detail in the circuit diagram of FIG. 10A. NOVRAM Compare Cell 400 comprises two electrically-erasable nonvolatile floating gate EEPROM cells 600 and 610 which are used to permanently store a single bit of information, a static latch 620 comprising P-type transistors 622 and 624 and N-type transistors 628 and 630, two high voltage pass transistors 640 and 644, two high voltage write transistors 650 and 654, and an exclusive-OR gate 660 (XOR). The control signals from control bus RDNCTL[4:0]are coupled in via port 440. These signals are: SWRT\, AGRDN, PIRDN, RWRT, and VCCSWT. Control signal REXWL is coupled into NOVRAM Compare Cell 400 via port 420 from Redundancy Decoder 100, shown in FIG. 6. Buffered address line ABUF[15] is coupled into NOVRAM Compare Cell 400 via port 450, and the high voltage address lines AHV[15] and complement AHV\[15] are coupled into NOVRAM Compare Cell 400 via ports 460 and 470, respectively.

The logic levels on the control signals during the normal-mode and redundancy-mode operations are shown at Table 690 in FIG. 10B. The signal SWRT\ is used to isolate the floating gate EEPROM cells 600 and 610 from latch 620 during redundancy-mode write operations and to couple the floating gate EEPROM cells 600 and 610 to latch 620 during all read operations. This function is provided by high voltage pass transistors 640 and 644. The control signals AGRDN and PIRDN are used to isolate one side of the floating gate in each EEPROM cell 600 and 610 during programming operations in the redundancy mode. Control signal RWRT is used along with high voltage write transistors 650 and 654 to couple in the address-line information during programming in the redundancy mode via high voltage address lines AHV[15] and AHV\[15]. Control signal VCCSWT is high for all operations in normal and redundancy modes and provides power to the latch 620 50 microseconds after power has been applied to the integrated circuit Semiconductor Memory Array 10. This delay ensures that latch 620 will properly duplicate, on system power up, the information stored in floating gate EEPROM cells 600 and 610. Control signal REXWL is used to activate the programming of floating gate EEPROM cells 600 and 610, as further described below. As indicated in TABLE 690, high voltage address lines AHV[15] and AHV\[15] are only used during redundancy-mode write operations.

A more detailed description of the circuit topology and operational elements of NOVRAM Compare Cell 400 is as follows. Floating gate EEPROM cell 600 comprises a drain 601, a source 602, a gate 604, a floating gate 606, and a gate 608. Likewise, floating gate EEPROM cell 610 comprises a drain 611, a source 612, a gate 614, a floating gate 616, and a gate 618. Sources 602 and 612 of floating gate EEPROM cells 600 and 610, respectively, are coupled together and to control signal AGRDN, gates 608 and 618 of EEPROM cells 600 and 610 are coupled together and to control signal PIRDN, and gates 604 and 614 are coupled together and to the control signal REXWL. The floating gates of EEPROM cells 600 and 610 are not electrically connected to any other structures. Preferably, in a three layer polysilicon integrated circuit implementation of these EEPROM cells, gates 608 and 618 comprise a first polysilicon layer, the floating gates 606 and 616 comprise a second polysilicon layer, and gates 604 and 614 comprise the third polysilicon layer. Other topologies are well known in the art for implementing an EEPROM cell.

Latch 620 is a standard cross-coupled CMOS inverter latch. Such latches are well known to the art. The first inverter is formed by P-type transistor 622 and N-type transistor 628 and the second inverter is formed by P-type transistor 624 and N-type transistor 630. Each of these transistors include source, gate, and drain terminals. The gate terminals of transistors 622 and 628 are connected together to form a first latch node 634. Likewise, the gates of transistors 624 and 630 are connected together to form a second latch node 636. The drain terminals of transistors 622 and 634 are connected together and coupled to second latch node 636, and the drain terminals of transistors 624 and 630 are coupled to first latch node 634. The source terminals for N-type transistors 628 and 630 are coupled to ground and the source terminals for P-type transistors 622 and 624 are coupled to control signal VCCSWT. The present state of latch 620 is taken from first latch node 634 and is connected to one input of XOR gate 660.

Latch 620 and the EEPROM cells 600 and 610 are coupled via high voltage pass transistors 640 and 644. The source terminal of high voltage pass transistor 640 is coupled to first latch node 634 and the source node of high voltage pass transistor 640 is coupled to second latch node 636. The drain of high voltage pass transistor 640 is coupled to the drain 601 of floating gate EEPROM cell 600 to form a first program node 670 and the drain of high voltage pass transistor 644 is coupled to the drain 611 of EEPROM cell 610 to form a second program node 680. The gates of high voltage pass transistors 640 and 644 are coupled together and in turn coupled to control signal SWRT\. Transistors 650 and 654 are used to couple in the high voltage address line signals when programming EEPROM cells 600 and 610. The drain of transistor 650 is coupled to address line AHV[15] and the source is coupled to first program node 670. Likewise the drain of transistor 654 is coupled to address line AHV\[15]. and the source is coupled to second program node 680. The gates of transistors 650 and 654 are tied together and coupled to control signal RWRT.

The EEPROM cells 600 and 610 are programmed with complementary logic states. After power up and after each program cycle, the contents of EEPROM cells 600 and 610 are transferred to latch 620 via high voltage pass transistors 640 and 644. If a logic one has been programmed into NOVRAM Compare Cell 400, first latch node 634 will be high and second latch node 636 will be low by means of EEPROM cells 600 and 610. If a zero has been programmed, first latch node 634 will be low and second latch node 636 will be high. The match signal BITMTCH\[0] is generated by comparing the logic level on first latch node 634, which is indicative of the latch's state, and the logic level on buffered address line ABUF[15] present on port 450. The comparison is done by XOR gate 660 which takes these signals as inputs and produces the bit match signal BITMTCH\[0] at port 410.

During normal mode operations, the control signals are set up to allow the information stored in floating gate EEPROM cells 600 and 610 to be transferred to latch 620. In the normal mode, signal SWRT\ is high and enables high voltage pass transistors 640 and 644 to couple the latch to the floating gate EEPROM cells 600 and 610. Control signals REXWL, PIRDN, and AGRDN are set to allow current to flow from the drain to the source of floating gate EEPROM cells 600 and 610, depending on the state of the floating gate, as taught in U.S. Pat. No. 4,599,706. If a floating gate is erased, it is at a positive voltage and its channel is turned on or conducting. If a floating gate is programmed, it is at a negative voltage and its channel is turned off or non-conducting. Signal VCCSWT provides power to the latch, which in turn provides current to flow through floating gate EEPROM cells 600 and 610 via high voltage pass transistors 640 and 644. VCCSWT is turned on after the signal REXWL, PIRDN and AGRDN are set, such that latch 620 will flip to the state when power is applied to the circuit, so as to reflects the then current state of EEPROM cells 600 and 610.

During a write operation in the redundancy mode, the latch structure is separated from EEPROM cells 600 and 610. Control signal SWRT \ applies a logic low to high voltage pass transistors 640 and 644 to provide the separation. In a similar manner control signals PIRDN and AGRDN become low and high respectively to isolate the floating gate structures in EEPROM cells 600 and 610 from their respective sources 602 and 612. The address line signals AHV[15] and AHV\[15] are coupled to first program node 670 and second program node 680, respectively, via transistors 650 and 654. Control signal RWRT goes to a high voltage of 22 volts to turn on transistors 650 and 654. This couples the high voltage signal provided by the address lines AHV[15] and AHV\[15] to the floating gate EEPROM cells 600 and 610. The REXWL signal is used to program floating gate EEPROM cells 600 and 610 as described in greater detail in Guterman, et al. U.S. patent application Ser. No. 335,112, filed Apr. 7, 1989, now U.S. Pat. No. 4,980,859.

NOVRAM Compare Cells 401–408 are identical in topology and operation to NOVRAM Compare Cell 400 with the exception that different address lines are used. Specifically, NOVRAM Compare Cells 401–408 use buffered address lines ABUF[14]-ABUF[7] respectively rather than buffered address line ABUF[15], use high voltage address lines AHV[14]-AHV[7] respectively rather than high voltage address line AHV[15], and use complement high voltage address lines AHV\[14]-AHV\[7] respectively rather than complement high voltage address line AHV\[15].

FIG. 11 is a more detailed circuit diagram of NOVRAM Bit Cell 500 contained in Redundant Row Decoder 120, as shown in FIG. 9. NOVRAM Bit Cell 500 comprises two electrically erasable, nonvolatile floating gate EEPROM devices 700 and 710 and a latch 720 defined by four transistors 722, 724, 728 and 730, by a first latch node 734, and a second latch node 736. NOVRAM Bit Cell 500 stores information in substantially the same way as NOVRAM Compare Cell 400, described above. Each element of NOVRAM Bit Cell 500 is the same as the corresponding element of NOVRAM Compare Cell 400 where the number designation of NOVRAM Bit Cell 500 is equal to the number designation of the corresponding element in NOVRAM Compare Cell 400 plus a value of 100. Furthermore, the interconnections among elements in NOVRAM Bit Cell 500 are substantially the same as the interconnections among the corresponding elements in NOVRAM Compare Cell 400.

NOVRAM Bit Cell 500 is responsive to control signals SWRT\, AGRDN, PIRDN, RWRT, VCCSWT, and REXWL in the same manner as NOVRAM Compare Cell 400. The only significant differences between NOVRAM Bit Cell 500 and NOVRAM Compare Cell 400 are the different high voltage address lines coupled to ports 508 and 510 (i.e., AHV[3] and AHV\[3] rather than AHV[15] and AHV\[15], respectively) and the lack of an XNOR gate at the output of NOVRAM Bit Cell 500. The output from NOVRAM Bit Cell 500 is taken from first latch node 734 and is coupled to port 512 as signal RDNDIS[0] for Redundant Row Decoder 120, as shown in FIG. 6.

NOVRAM Bit Cell 520 contained in Redundant Row Decoder 120, as shown in FIG. 9, is identical to NOVRAM Bit Cell 500 with the exception that NOVRAM Bit Cell is responsive to high voltage address lines AHV[2] and AHV\[2] rather than AHV[3] and AHV\[3], respectively. Furthermore, NOVRAM Bit Cell 520 is responsive to control signals SWRT\, AGRDN. PIRDN, RWRT, VCCSWT, and REXWL in the same manner as NOVRAM Bit Cell 500.

It may be appreciated that NOVRAM Compare Cells 400–408 and NOVRAM Bit Cells 500 and 520 may use other means to store their respective nonvolatile information. For example, a single floating gate EEPROM cell and a pull-up resistor or transistor may be used to store a single bit of information, such as taught in U.S. Pat. No. 4,274,012. As an additional example, a single floating gate EEPROM cell in combination with a cross-coupled inverter latch may be used, as taught in U.S. Pat. Nos. 4,300,212 and 4,263,664.

Bit Line Combiner Selector 200 of Semiconductor Memory Array 10, shown in FIG. 4, is illustrated in greater detail in FIG. 12. Bit Line Combiner-Selector 200 is coupled to eight bit line groups 50–57 at ports 210–217 and is coupled to I/O bus 16 at bit ports 220–227. Bit Line Combiner-Selector 200 is responsive to the redundancy mode signal RDNL at port 202, to the redundancy disabled signals RDNDIS[7:0] at port 204, to the redundant match signals RDNMTCH[7:0] at port 206, the match-one signal MTCHONE at port 207, and address lines A[6:0] at port 208.

The main purpose of Bit Line Combiner-Selector 200 is to select one bit line from the 128 bit lines in each bit line group, which are coupled in at bit line group ports 210–217, and to couple the one selected bit line of each bit line group to the corresponding bit line ports 220–227 for connection to I/O bus 16. The eight bit selections are done by eight Multiplexers 850–857, which can be implemented in a manner well known in the art. Multiplexers 850–857 each have respective bit-group ports 870–877, which are coupled to the bit line groups 50–57, respectively, via bit line ports 210–217, respectively. Multiplexers 850–857 further comprise eight bit ports 890–897, each of which couples the selected one bit of 128 bits from their respective Multiplexer to the corresponding one of bit line ports 220–227. Each Multiplexer uses address lines A[6:0] to make the selection and these address lines are received at address bus ports 860–867 for Multiplexers 850–857, respectively.

In other embodiments of Bit Line Combiner-Selector 200, Multiplexer 850–857 may further comprise enable ports responsive to the chip enable signal CE \ so that the bit ports 890–897 may be put in a high impedance state when the chip enable signal is a logic high. The incorporation of the enable ports allows the I/O buses of many semiconductor memory arrays to be coupled together in a system environment.

The description of the operation for Bit Line Combiner-Selector 200 thus far is well known to and taught by the prior art. To implement the Field-Programmable Redundancy Apparatus of the present invention, Bit Line Combiner-Selector 200 further comprises an eight-line Buffer 800, an eight-to-three Encoder 804 having three outputs, and a one-line Buffer 824 having one output. Buffers 800, 824 and Encoder 804 are used to direct the outputs from Redundancy Decoder 100 shown in FIG. 6 to I/O bus 16 during redundancy-mode operations.

Buffer 800 comprises an eight-input port 802 for receiving the redundant-row disable signals RDNDIS[7:0] from Redundancy Decoder 100, an enable port 801 coupled to the redundancy-mode signal RDNL provided at port 202, and outputs 810-817 which output disable signals RDNDIS[0]-RDNDIS[7], respectively. Outputs 810-817 are coupled to junctions 830-837 which are coupled to the last line of each bit group 50-57, respectively. Since the bit lines in each bit line group are indexed from 0, the last line has a decimal address of 127.

In operation, Buffer 800 sets outputs 810-817 in a high impedance state when the signal at enable port 810 is low, thus preventing contention with information present in the bit-line groups during the normal mode. In the redundancy mode, the redundancy signal RDNL is coupled to enable port 801 and the disable signals RDNDIS[0]-RDNDIS[7] are coupled to junctions 830-837, respectively, and thereby to I/O bus 16. While in the redundancy mode, bit line groups 50-57, which are coupled into ports 210-217, are deactivated by Standard Read/Write Control 70 shown in FIG. 4 along with the Standard Read/Write Circuitry 37 and 87 present in Primary Memory Array 36 and Redundant Memory Array 86, respectively, thereby preventing contention with the signals provided by Buffer 800 at junctions 830-837. The deactivation of bit lines 50-57 via the Standard Read/Write Circuitry 37 and 87 is well known within the art.

In a similar manner, the information provided by the redundancy-match signals RDNMTCH[7:0] at port 206 is coupled to I/O bus 16 via eight-to-three encoder 804 and junctions 840-842. Encoder 804 comprises an enable port 805 coupled to the redundancy mode signal at port 202, an input 806 for receiving the eight signals to be encoded, and encoded outputs 820-822 which are coupled to junction points 840-842, respectively. Junctions 840-842 are coupled at the next-to-last bit line in each bit line group 50-52, respectively, which are coupled into bit line combiner-selector 200 via ports 210-212. Junctions 840-842 are tied to lines which are addressed by a decimal value of 126. With respect to the enable port 805, Encoder 804 functions substantially the same as Buffer 800. When activated by a high signal at enable port 805 via redundancy signal RDNL, encoder 804 encodes the information present in signals RDNMTCH[7:0]and transmits the information through outputs 820-822 to the corresponding bit line groups. When the redundancy mode signal is low at enable port 805, encoder 804 places encoded outputs 820-822 in a high impedance state, thus preventing contention on the bit lines with information present on bit line groups 50-52.

In a similar manner, the MTCHONE signal present at port 207 is coupled to I/O bus line I/O[3] via one line Buffer 824. Buffer 824 comprises an enable port 826 coupled to the redundancy mode signal RDNL, an input 827 coupled to port 207 bearing the MTCHONE signal, and an output 823 coupled to junction point 843. Junction 843 is coupled to the bit line in bit line group 53 present at port 213 which has the decimal address of 126. The enable function of Buffer 824 is the same as the enable function of Buffer 800.

Referring back to the Signal Line Control Table 300 shown in FIG. 5, the configuration of Buffers 800, 824, Encoder 804, and junctions 830-837 and 840-843 may now be further appreciated. The redundancy elements in Bit Line Combiner-Selector 200 are only used during read operations in the redundancy mode, which are shown at 304 and 305 in FIG. 5. The Read Redundant Row ID operation 304 takes a primary row address contained in address lines A[15:7] and a predetermined value in address lines A[6:0] equal to a decimal value of 126 and provides redundancy row ID information on the four I/O lines I/O[3:0]. The predetermined code of value equal to the decimal value of 126 is provided to Bit Line Combiner-Selector 200 at address lines A[6:0] at port 208, which causes Multiplexers 850-857 to select the corresponding bit lines having the decimal address value of 126. In the redundancy mode, this allows information at junctions 840-843 to to be coupled to I/O lines I/O[0]-I/O[3], respectively. Encoder 804 provides the information contained at I/O lines I/O[2:0] of Read Redundant Row ID Operation 304 in FIG. 5, and Buffer 824 provides the information contained at I/O line I/O[3] of Read Redundant Row ID Operation 304 in FIG. 5.

In a similar manner, the Read Bad Redundant Row status operation 305 shown in FIG. 5 takes a predetermined code at address lines A[6:0] equal to a decimal value of 127 and outputs the bad row status on I/O lines I/O[7:0]. The predetermined code sequence of 127 is coupled to address lines A[6:0] of Bit Line Combiner-Selector 200 and to Multiplexers 850-857. In the redundancy mode, the information present at junctions 830-837 is then coupled to I/O lines I/O[0]I/O-[7], respectively. The disable signals RDNDIS[7:0]from Redundancy Decoder 100 are thereby routed to data bus 16, as also seen in FIG. 4. It may be appreciated that redundancy information, such as the total number of redundant rows available for programming, can also be output through the selector lines with additional buffers, junctions, and logic circuitry well known to the art. It may be further appreciated that other bit lines with address values different from 126 and 127 may be used to couple out redundancy information from Redundancy Decoder 100.

Redundancy Mode Detector 26, shown in Semiconductor Memory Array 10 of FIG. 4, is shown in greater detail in the logic circuit diagram shown in FIG. 13. Redundancy Mode Detector 26 is responsive to address lines A[15:0] at port 30, control lines CE\, WE\, and OE\ at port 28, and I/O bus lines I/O[7:0] at port 32. During normal-mode operation, according to one preferred embodiment of the present invention, Redundancy Mode Detector 26 looks for a pattern of six sequential write operations to two address locations, as shown by the following table:

TABLE I

| Address | Data |
|---------|------|
| $5555_H$ | $AA_H$ |
| $AAA_H$ | $55_H$ |
| $5555_H$ | $80_H$ |
| $5555_H$ | $AA_H$ |
| $AAAA_H$ | $55_H$ |
| $5555_H$ | $F0_H$ |

The combination of address and data value in row one is the same as that in row four and the combination of address and data value in row two is the same as that in row five. Consequently, a total of four different combinations are shown in the above table.

To detect the above combinations of address and data values, Redundancy Mode Detector 26 comprises an I/O Comparator 900, an Address Comparator 906, and four AND gates 912, 916, 920, and 924. To detect the above sequence of addresses and corresponding data values, Redundancy Mode Detector 26 comprises six set-reset latches 950–955, six AND gates 930–935, and NOR gates 996 and 998. Set-reset latches 950–955 are well known to the art and comprise set terminals 960–965 respectively, reset terminals 980–985 respectively, clock terminals 990–995 respectively, and outputs 970–975 respectively. Clock terminals 990–995 are responsive to a clock bus 1160, which carries a clock signal generated by an AND gate 1140. Reset terminals 980–985 are responsive to a reset bus 1170, which carries a reset signal generated by an OR gate 1150 and two AND gates 1120 and 1130.

Each of set-reset latches 950–955 operates such that its logic state, as represented by outputs 970–971 respectively, becomes high when its set terminal is high and its reset terminal is low, and becomes low when its set terminal is low and its reset terminal is high. When the set and reset terminal lines are both low, the state of the latch is held steady. A logic high on both set and reset terminals of a set-reset latch is not allowed. Each of set-reset latches 950–955 operates such that the transfer of data from set terminals 960–965 to outputs 970–975 is synchronous with the positive edge transition of the clock signal on clock terminals 990–995 and the transfer of data from the reset terminals 980–985 is asynchronous with respect to the clock signal on clock terminals 990–995.

I/O Comparator 900 receives I/O bus 32 containing signals I/O[7:0] at port 901, and generates four signals at ports 902–905. An active signal on port 902 indicates that the value of $AA_H$ is present on I/O lines [7:0], an active signal on port 903 indicates that a value of $55_H$ is present on data lines I/O [7:0], an active signal on port 904 indicates that a value of $80_H$ is present on data lines I/O[7:0], and an active signal on port 905 indicates that a value of $FO_H$ is present on data lines I/O[7:0]. In a similar manner, address comparator 906 receives address bus 30 containing address lines A[15:0] at a port 907 and generates output signals at ports 908 and 909. An active signal at port 908 indicates that an address of $5555_H$ is present on address lines A[15:0] and an active signal on port 909 indicates that a value of $AAAA_H$ is present on address lines A[15:0]. The signals on ports 902–905 and ports 908 and 909 are coupled to the inputs of AND gates 912, 916, 920, and 924 to detect the four different address-data combinations present in TABLE I. Specifically, the combination $5555_H/AA_H$ is detected at an output 913 of AND gate 912, the combination $AAAA_H/55_H$ is detected at an output 917 of AND gate 916, the combination $5555_H/80_H$ is detected at an output 921 of AND gate 920, and combination $5555_H/FO_H$ is detected at an output 925 of AND gate 924.

Set-reset latches 950–955 and AND gate 930–935 form a six-stage shift register and are used to detect the sequence in the address-data combinations given in TABLE I. Each AND gate 930–935 includes an output 940–945, respectively, and output 940–945 are coupled to set terminals 960–965, respectively, of latches 950–955. One input of each AND gate 930–935 couples in a signal detecting one of the address-data combinations. A second input of each AND gate 931–935 couples in the outputs of set-reset latches 950–954, respectively. A second input of AND gate 930 couples in the output 999 of NOR gate 998, which couples latch outputs 971–974 as inputs. Latch output 975 of set-reset latch 955 couples out redundancy mode signal RDNL.

Each time a write operation occurs in the normal mode, set-reset latches 950–955 are clocked via AND gate 1140. AND gate 1140 is responsive to control signal CE\, WE\, and OE\. Write enable signal WE\ and chip enable signal CE are inverted at the respective inputs of AND gate 1140 as indicated by the bubble symbols. A positive edge transition occurs on clock bus 1160 when all of the control signals OE\, WE\, and CE \ go to a state indicating a write to Semiconductor Memory Array 10, i.e., high, low and low, respectively. Upon a positive edge transition on their respective clock terminals 990–995, the states of set-reset latches 950–955 change according to the logic states present at set terminals 960–965, and are then coupled to output terminals 970–975.

Set-reset latches 950–955 are responsive to the reset signal on reset bus 1170, which is generated from the output of OR gate 1150. Three possible conditions will generate a reset signal: initial power up of Semiconductor Memory Array 10, an incorrect address-data combination, and a request to exit the redundancy mode. Each of these conditions are presented as signals to the respective three inputs of OR gate 1150. Specifically, the power up reset signal is generated by resistor 926, capacitor 927 and inverter 928, which forms an RC-delay circuit followed by an inverter. The incorrect address condition is detected by NOR gate 996 and AND gate 1120. The detection signals at outputs 913, 917, 921 and 925 are coupled as inputs to NOR gate 996, which places a logic high on an output 997 when an incorrect combination is detected. AND gate 1120 is used to couple the detection of an incorrect combination to an input of OR gate 1150 only when Semiconductor Memory Array 10 is in the normal mode. The detection of Exit Redundancy Mode operation 309 is performed by AND gate 1130, which uses the redundancy mode signal RDNL, address line A[0], and the clock signal from the output of AND gate 1140 as inputs. As discussed previously, a logic high on address line A[0] is used to distinguish the Exit Redundancy Operation 309 from all other redundancy mode operations during the redundancy mode. The clock bus is coupled to AND gates 1120 and 1130 as inputs and the reset signals generated by AND gates 1120 and 1130 are synchronized to the clock signal.

The detection of the proper sequence of address-data combinations is now described with the assumption that set-reset latches 950–955 initially have a logic low output state at outputs 970–975, respectively. With the writing of the first combination $5555_H/AA_H$, a logic high is clocked into set/reset latch 950. With the writing of the second combination $AAAA_H/55_H$, the logic high state at output 970 of latch 950 is transferred to set terminal 961 of latch 951. The state of Latch 950 remains logic high until reset terminal 980 is activated with a logic high. At this point, the output 999 of NOR gate 998 is low, which maintains a logic 0 at set terminal of latch 950. With the writing of the third combination $5555_H/80_H$, the logic high state in latch 951 is transferred to latch 952 in a similar manner and the states of latches 950 and 951 remain logic high. As the remaining combinations are written into Redundancy Mode Detector 26, the logic high level propagates towards latch 955, where it is output at output 975 as the redundancy mode signal RDNL at port 34. If an incorrect combination is given during this propagation on latches 950–955, a reset signal is generated by NOR gate 996 which resets the logic states of latches 950–955 to a low state. Upon the activation of the redundancy mode signal RDNL, the Field-Programmable Redundancy Apparatus of the present invention is activated and Semiconductor Memory Array 10 enters the redundancy mode.

To exit the redundancy mode, the signal configuration given by Operation 309 is FIG. 5 is executed. This operation writes a byte corresponding to any hexadecimal value (i.e., don't cares) to address FFFF$_H$, which activates a reset signal on latches 950-955 via AND gate 1130 and OR gate 1150. The address line A[0] distinguishes this redundancy program operation from all other redundancy program operations in Signal Line Control Table 300 (e.g., operations 306, 307 and 308) and the contents of the eighth redundant row address 7$_H$ is not disturbed. The use of address line A[0] in Redundancy Decoder 100 to prevent the programming of the eighth redundant row during the exit operation is shown at AND gate 189 in FIG. 6.

It may be appreciated that more set-reset latches or less set-reset latches may be used to construct longer or shorter address-data combination sequences and that different I/O data may be detected by I/O comparator 900 and different addresses may be detected by address comparator 906. It may be further appreciated that the combinations may only comprise address values or only data values, thereby eliminating the need for I/O comparator 900 or address comparator 906, respectively. It may be also appreciated that I/O comparator 900 and address comparator 906 may comprise nonvolatile memory means so that the redundancy mode sequence may be altered by the user for convenience of use.

The operations required in the redundancy mode to replace a primary row with a redundant row are detailed in FIG. 14 by a Operation Flow Chart 1000. The user first enters the redundancy mode, shown by a block 1002 of FIG. 14, by entering in the predetermined code sequence with normal mode write operations, shown at 303 in FIG. 5, which is detected by Redundancy Mode Detector 26 shown in FIG. 13. Once in redundancy mode, the user interrogates each primary row address to determine mapping of redundant rows, as shown by a block 1004 in FIG. 14. The interrogation of primary rows is done by Read Redundant Row ID Operation 304, where the user provides the primary row address on address lines A[15:7] and reads which redundant row, if any, is currently replacing the given primary row address. The user then interrogates the redundancy apparatus to determine which redundant rows are non-functional or bad which is shown by a block 1006. Read Bad Redundant Row Status Operation 305 is used for this purpose. The bad row status is read off from I/O lines I/O[7:0] where each I/O line corresponds to each redundant row and is high if the corresponding redundant row is non-functional.

From the preceding two interrogation operations shown by blocks 1004 and 1006, the user constructs a list of available redundant rows as shown in a block 1008 of FIG. 14. The user chooses one of these redundant rows to replace the given primary row to be replaced. There is, however, a possibility that the given primary row has already been replaced by a redundant row. Hence, the user may check for this condition, as shown by a block 1010 in FIG. 14, by applying Read Redundant Row ID operation 304 to the primary row to be replaced. If the row has been replaced previously, I/O line I/O[3] will be high and the corresponding redundant row ID will be given by I/O lines I/O[2:0]. If the primary row has not been previously replaced by a redundant row, the user may proceed to replace the primary row, as shown in a block 1016 of FIG. 14, with Program Redundant Row Address operation 306 shown in FIG. 5. In this operation, the primary row address to be replaced is placed on address lines A[15:7], the redundant row ID is placed on address lines A[6:4], and address lines A[3:0] are set to their appropriate values to indicate that a Program Redundant Row Address operation 306 is to occur.

If, however, the given primary row to be replaced is currently replaced by a redundant row, the user must first nullify, or undo, the previous replacement before making the new replacement. The undoing of the previous replacement is shown at a block 1012 of FIG. 14 and is done with Reset Redundant Row Address operation 307 shown in FIG. 5. In this operation, the address of the redundant row to be reset is given on address lines A[6:4] and address lines A[3:0] are set to their appropriate logic values. The row is then marked as a failed redundant row, as shown by a block 1014, with the Mark Bad Redundant Row operation 308 shown in FIG. 5. In this operation, the address of the redundant row to be marked is given on address lines A[6:4] and address lines A[3:0] are set to their appropriate logic values. Once the bad redundant row has been marked, the user proceeds to block 1016 where the replacement of the failed row with a functional and available redundant row can be made. Once the replacement is made, the user may exit the redundancy mode as shown by a block 1018, with Exit Redundancy Mode operation 309 shown in FIG. 5. In this operation, all address lines A[15:0] are set to a high value.

While the invention has been described in connection with what is presently considered to be the most practical and preferred embodiment(s), it is to be understood that the present invention is not limited to the disclosed embodiment(s) but, on the contrary is intended to cover various modifications and equivalent arrangements included within the scope of the appended claims.

What is claimed is:

1. In an integrated circuit memory array including a plurality of primary memory cells, each said primary memory cell for storing data, a plurality of redundant memory cells, each said redundant memory cell for storing data, address means for enabling each of said primary memory cells to be accessed when a corresponding unique address is coupled thereto on a plurality of address lines, said address means using standard binary logic voltage levels when coupling said unique address onto said address lines, and read/write means for reading data from and for writing data to each said primary memory cell on a plurality of data lines when the address of said primary memory cell is coupled to said address means, said read/write means using standard binary logic voltage levels for data states on said data lines, a field-programmable redundancy system for enabling said integrated circuit memory array to temporarily enter a special reconfiguration mode for replacing a selected one of said primary memory cells with an available one of said plurality of redundant memory cells such that data is exchanged by said read/write means with said redundant memory cell when the address of said replaced primary memory cell is coupled to said address means, comprising:

means for detecting a predetermined code sequence on one or more of said address and data lines;

means for causing said integrated circuit memory array to enter said reconfiguration mode when said predetermined code sequence is detected;

means responsive to said entry into said reconfiguration mode for disabling normal accessing of said primary memory cells by said address means and said read/write means;

means during said reconfiguration mode for receiving the address of a selected primary memory cell to be replaced by a redundant memory cell and for identifying and selecting an available redundant memory cell to be used to replace said selected primary memory cell;

reconfiguration means responsive to said receiving means during said reconfiguration mode for replacing said selected primary memory cell with said selected redundant memory cell such that said selected redundant memory cell is thereafter accessed when the address of said selected primary memory cell is coupled to said address means; and means for causing said integrated circuit memory array to exit said reconfiguration mode.

2. The field-programmable redundancy system of claim 1 wherein said means for identifying and selecting an available redundant memory cell includes means for identifying which of said redundant memory cells are available for use and means for coupling the identity of each said available redundant memory cell to said read/write means.

3. The field-programmable redundancy system of claim 1 wherein said means for identifying and selecting an available redundant memory cell includes means for determining which of said redundant memory cells are currently in use and means for coupling the identity of redundant memory cells not currently in use to said read/write means.

4. The field-programmable redundancy system of claim 1 wherein said means for identifying and selecting an available redundant memory cell includes means for determining if a selected primary memory cell is currently replaced by a redundant memory cell when the address of said selected primary memory cell is coupled to said address means, including means for coupling the identity of said redundant memory cell to said read/write means.

5. The field-programmable redundancy system of claim 1 wherein said reconfiguration means further comprises means for replacing a first redundant memory cell which had previously replaced a selected primary memory cell with a second redundant memory cell.

6. The field-programmable redundancy system of claim 5 wherein said reconfiguration means causes said first redundant cell to be marked as non-functional.

7. The field-programmable redundancy system of claim 1 wherein said reconfiguration means comprises means for detecting the address of a selected primary memory cell currently replaced by a redundant memory cell and reset means responsive to said detecting means for undoing said replacement of said selected primary memory cell.

8. The field-programmable redundancy system of claim 1 wherein said reconfiguration means includes means for storing the address of each primary memory cell currently replaced by a redundant memory cell in a non-volatile memory.

9. The field-programmable redundancy system of claim 1 wherein said means for causing said integrated circuit memory array to exit said reconfiguration mode includes means for detecting a second predetermined code sequence on one or more of said address and data lines.

10. The field-programmable redundancy system of claim 1 wherein said reconfiguration means includes a redundancy decoder responsive to signals on one or more of said address lines for selectively addressing each of said redundant memory cells, said redundancy decoder including a plurality of redundant cell decoders, each said redundant cell decoder responsive to a predetermined address on said address lines for accessing a corresponding one of said redundant memory cells.

11. The field-programmable redundancy system of claim 10 wherein each said redundant cell decoder comprises:

a first non-volatile memory for storing the address of a primary memory cell;

a second non-volatile memory for storing the status of said corresponding redundant memory cell as being in use when said redundant memory cell is being used as a replacement memory cell for one of said primary memory cells;

means for detecting a match condition between the primary memory cell address appearing on said address lines and the address stored in said first nonvolatile memory and for outputting a match condition signal only when said second non-volatile memory indicates said corresponding redundant memory cell is in use; and means responsive to said match condition signal when said integrated circuit memory array is not in said reconfiguration mode for disabling the addressing of said replaced primary memory cell and for enabling the addressing of the redundant memory cell corresponding to said redundant cell decoder.

12. The field-programmable redundancy system of claim 11 wherein said means for identifying and selecting an available redundant memory cell includes means responsive to a given primary memory cell address appearing on said address lines for outputting a match condition signal on one or more of said data lines when the primary memory cell specified by said address has been replaced by one of said redundant memory cells, and for outputting on said data lines the identity of said one of said redundant memory cells replacing said specified primary memory cell.

13. The field-programmable redundancy system of claim 11 wherein each said redundant cell decoder further includes a third nonvolatile memory for storing the status of said corresponding redundant memory cell as being non-functional.

14. The field-programmable redundancy system of claim 13 wherein said means for identifying and selecting an available redundant memory cell includes means responsive to said third memories of said redundant cell decoders for outputting said nonfunctional status of each said redundant memory cell on said data lines.

15. The field-programmable redundancy system of claim 11 wherein each of said primary memory cells comprises a plurality of memory bits equal to a predetermined number, said memory bits of said primary memory cell organized as a row and called a primary memory row, and wherein each of said redundant memory cells comprises a plurality of memory bits equal to said predetermined number, said memory bits of said redundant memory cell organized as a row and called a redundant memory row.

16. The field-programmable redundancy system of claim 15 wherein said read/write means comprises a plurality of column bit lines for each said data line, the total of said column bit lines equal to said predetermined number of memory bits of each said primary memory row, and wherein each said column bit line is coupled to one memory bit of each of said primary memory rows such that data can be exchanged between said one memory bit and said read/write means.

17. The field-programmable redundancy system of claim 16 wherein a number of said plurality of address lines of said address means are used to address said primary rows and are designated as row address lines, and wherein the remainder of said plurality of address lines of said address means are used to address said column bit lines of each said data line and are designated as column address lines.

18. The field-programmable redundancy system of claim 11 wherein said reconfiguration means includes:
means for programming each of said first nonvolatile memories of said redundant cell decoders during said reconfiguration mode such that the first nonvolatile memory in a selected redundant cell decoder is programmed with the address of the primary memory cell to be replaced by the redundant memory cell corresponding to said selected redundant cell decoder; and
means for programming each of said second nonvolatile memories of said redundant cell decoders during said reconfiguration mode to indicate for each said redundant cell decoder that its corresponding redundant memory cell is in use.

19. The field-programmable redundancy system of claim 11 wherein each of said first non-volatile memories of said redundant cell decoders comprises one or more memory bits, each said memory bit comprising at least one EEPROM cell.

20. The field-programmable redundancy system of claim 1 wherein said read/write means includes means responsive to a plurality of control signals for controlling whether said integrated circuit memory array performs a read operation or a write operation to an addressed memory cell, said read/write means detecting standard binary logic voltage levels for the control signal states provided thereto.

21. An integrated circuit memory array comprising:
a plurality of primary memory cells, each said primary memory cell for storing data;
a plurality of redundant memory cells, each said redundant memory cell for storing data;
address means for enabling each of said primary memory cells to be accessed when a corresponding unique address is coupled thereto on a plurality of address lines, said address means using standard binary logic voltage levels when coupling said unique address onto said address lines;
read/write means for reading data from and for writing data to each said primary memory cell on a plurality of data lines when the address of said primary memory cell is coupled to said address means, said read/write means using standard binary logic voltage levels for data states on said data lines; and
means for enabling said integrated circuit memory array to temporarily enter a special reconfiguration mode for replacing a selected one of said primary memory cells with an available one of said plurality of redundant memory cells such that data is exchanged by said read/write means with said redundant memory cell when the address of said replaced primary memory cell is coupled to said address means, said means including:
means for detecting a predetermined code sequence on one or more of said address and data lines;
means for causing said integrated circuit memory array to enter said reconfiguration mode when said predetermined code sequence is detected;
means responsive to said entry into said reconfiguration mode for disabling normal accessing of said primary memory cells by said address means and said read/write means;
means during said reconfiguration mode for receiving the address of a selected primary memory cell to be replaced by a redundant memory cell and for identifying and selecting an available redundant memory cell to be used to replace said selected primary memory cell;
reconfiguration means responsive to said receiving means during said reconfiguration mode for replacing said selected primary memory cell with said selected redundant memory cell such that said selected redundant memory cell is thereafter accessed when the address of said selected primary memory cell is coupled to said address means; and
means for causing said integrated circuit memory array to exit said reconfiguration mode.

22. The integrated circuit memory array of claim 21 wherein said integrated circuit memory array is contained in a single integrated circuit package having a plurality of pins, said pins providing said address lines and data lines to said integrated circuit memory array.

23. In an integrated circuit memory array including a plurality of primary memory rows, each said primary memory row comprising a plurality of memory bits equal to a predetermined number and for storing data, a plurality of redundant memory rows comprising a plurality of memory bits equal to said predetermined number and for storing data, address means for enabling each of said memory bits of said primary memory rows to be accessed when a corresponding unique address is coupled thereto on a plurality of address lines, said address means using standard binary logic voltage levels when coupling said unique address onto said address lines, said address means arranged such that a predetermined number of said plurality of address lines of said address means are used to address said primary memory rows and are designated as row address lines, and read/write means for reading data from and for writing data to each of said memory bits of said primary memory rows on a plurality of data lines when the address of said primary memory row is coupled to said address means, said read/write means using standard binary logic voltage levels for data states on said data lines, a field programmable redundancy system for enabling said integrated circuit memory array to temporarily enter a special reconfiguration mode for replacing a selected one of said primary memory rows with an available one of said plurality of redundant memory rows such that data is exchanged by said read/write means with said redundant memory row when the row address of said replaced primary memory row is provided to said address means, comprising:
means for detecting a predetermined code sequence on one or more of said address and data lines;

means for causing said integrated circuit memory array to enter said reconfiguration mode when said predetermined code sequence is detected;

means responsive to said entry into said reconfiguration mode for disabling normal access of said primary memory rows by said address means and said read/write means;

means during said reconfiguration mode for receiving the row address of a selected primary memory row to be replaced by a redundant memory row and for identifying and selecting an available redundant memory row to be used to replace said selected primary memory row, said means including a redundancy decoder responsive to signals on one or more of said address lines for selectively addressing each of said redundant memory rows, said redundancy decoder including a plurality of redundant row decoders, each said redundant row decoder responsive to a predetermined address on said address lines for accessing a corresponding one of said redundant memory rows, each said redundant row decoder including a first non-volatile memory for storing the address of a primary memory row, a second non-volatile memory for storing the status of said corresponding redundant memory row as being in use when said redundant memory row is being used as a replacement memory row for one of said primary memory rows, means for detecting a match condition between the primary memory row address appearing on said address lines and the row address stored in said first non-volatile memory and for outputting a match condition signal only when said second non-volatile memory indicates said corresponding redundant memory row is in use, and means responsive to a given primary memory row address appearing on said address lines for outputting a match condition signal on one or more of said data lines when the primary memory row specified by said address has been replaced by one of said redundant memory rows, and for outputting on said data lines the identity of said one of said redundant memory rows replacing said specified primary memory row;

reconfiguration means responsive to said receiving means during said reconfiguration mode for replacing said selected primary memory row with said selected redundant memory row such that said selected redundant memory row is thereafter accessed when the row address of said selected primary memory row is coupled to said address means, said means including means responsive to said match condition signal when said integrated circuit memory array is not in said reconfiguration mode for disabling the addressing of said replaced primary memory row and for enabling the addressing of the redundant memory row corresponding to said redundant row decoder, means for programming each of said first non-volatile memories of said redundant row decoders such that the first non-volatile memory in a selected redundant row decoder is programmed with the row address of the primary memory row to be replaced by the redundant memory row corresponding to said selected redundant row decoder, and means for programming each of said second non-volatile memories of said redundant row decoders to indicate for each said redundant row decoder that its corresponding redundant memory row is in use; and means for causing said integrated circuit memory array to exit said reconfiguration mode.

24. The field-programmable redundancy system of claim 23 wherein each of said first non-volatile memories of said redundant cell decoders comprises one or more memory bits, each said memory bit comprising at least one EEPROM cell.

25. In an integrated circuit memory array having a plurality of primary memory cells and a plurality of redundant memory cells, address lines for selectively addressing each of said primary memory cells and one or more data lines for writing of data to or read out of data from each said primary memory cell when that cell has been selectively addressed, a method for replacing a defective one of said primary memory cells with an available one of said redundant memory cells comprising the steps of:

detecting a first predetermined code sequence on one or more of said address and data lines of said integrated circuit memory array;

causing said integrated circuit memory array to enter a reconfiguration mode of operation when said first predetermined code sequence is detected;

identifying and selecting an available redundant memory cell in said reconfiguration mode;

replacing said defective primary cell with said selected available redundant cell in said reconfiguration mode such that said selected redundant memory cell is accessed for data transfer on said data lines when the address of said defective primary memory cell is thereafter placed on said address lines; and causing said integrated circuit memory array to exit said reconfiguration mode of operation when a second predetermined code sequence is detected on one or more of said address and data lines.

26. The method of claim 25 wherein the step of identifying and selecting an available redundant memory cell comprises the steps of:

interrogating said primary cells to determine which of said redundant cells are currently mapped to said primary cells, if any, thereby determining which of said redundant cells are being used as replacement cells;

interrogating said redundancy system to determine which of said redundant cells are not functional;

selecting said available redundant cell from the remaining unused and functional redundant cells in said integrated circuit memory array.

27. The method of claim 26 wherein the step of replacing said defective cell with said selected redundant memory cell further comprises the steps of:

determining if said defective primary cell had previously been replaced by one of said redundant cells which is now also defective;

undoing the replacement of said defective primary cell by said defective redundant cell; and marking said redundant cell as non-functional.

* * * * *